United States Patent
Jiang et al.

(10) Patent No.: US 12,244,117 B2
(45) Date of Patent: Mar. 4, 2025

(54) HIGH-VOLTAGE PULSE GENERATOR, GAS LASER APPARATUS, AND METHOD FOR MANUFACTURING ELECTRONIC DEVICE

(71) Applicants: National University Corporation Nagaoka University of Technology, Niigata (JP); Gigaphoton Inc., Tochigi (JP)

(72) Inventors: Weihua Jiang, Nagaoka (JP); Hiroshi Umeda, Oyama (JP)

(73) Assignees: National University Corporation Nagaoka University of Technology, Niigata (JP); Gigaphoton Inc., Tochigi (JP)

( * ) Notice: Subject to any disclaimer, the term of this patent is extended or adjusted under 35 U.S.C. 154(b) by 807 days.

(21) Appl. No.: 17/397,375

(22) Filed: Aug. 9, 2021

(65) Prior Publication Data
US 2021/0367394 A1 Nov. 25, 2021

Related U.S. Application Data

(63) Continuation of application No. PCT/JP2019/012902, filed on Mar. 26, 2019.

(51) Int. Cl.
H01S 3/097 (2006.01)
H01S 3/038 (2006.01)
H01S 3/0975 (2006.01)

(52) U.S. Cl.
CPC .......... *H01S 3/09702* (2013.01); *H01S 3/038* (2013.01); *H01S 3/0975* (2013.01)

(58) Field of Classification Search
CPC .................. H01S 3/09702; H01S 3/09705
See application file for complete search history.

(56) References Cited

U.S. PATENT DOCUMENTS 5,568,226 A 10/1996 Kusano
5,936,988 A 8/1999 Partlo et al.
(Continued)

FOREIGN PATENT DOCUMENTS

CN 102447213 A 5/2012
CN 103155307 A 6/2013
(Continued)

OTHER PUBLICATIONS

JP2005130576 (English translation) (Year: 2005).*
(Continued)

*Primary Examiner* — Xinning(Tom) Niu
*Assistant Examiner* — Delma R Forde
(74) *Attorney, Agent, or Firm* — Studebaker Brackett PLLC

(57) ABSTRACT

A high-voltage pulse generation device configured to apply a pulsed high voltage to the space between a pair of discharge electrodes disposed in a laser chamber of a gas laser apparatus includes n transformer cores that form a transformer, where n is a natural number greater than or equal to two, n primary electric circuits of the transformer, the n primary electric circuits each having a first terminal connected to a reference potential and a second terminal connected to a charger, the n primary electric circuits each including one or more primary coils, one or more diodes connected in parallel to the one or more primary coils, and one or more pulse generators connected in parallel to the one or more primary coils, and a secondary electric circuit of the transformer, the secondary electric circuit including a secondary coil and connected to the pair of discharge electrodes.

20 Claims, 12 Drawing Sheets

(56) References Cited

U.S. PATENT DOCUMENTS

| | | | |
|---|---|---|---|
| 2004/0182838 A1* | 9/2004 | Das | H01S 3/005 219/121.76 |
| 2012/0269223 A1 | 10/2012 | Targsdorf et al. | |
| 2015/0255948 A1 | 9/2015 | Von Bergmann et al. | |
| 2017/0338618 A1 | 11/2017 | Jiang et al. | |
| 2017/0346252 A1 | 11/2017 | Katsuumi et al. | |
| 2018/0191124 A1 | 7/2018 | Umeda et al. | |
| 2019/0148905 A1 | 5/2019 | Umeda et al. | |

FOREIGN PATENT DOCUMENTS

| | | | |
|---|---|---|---|
| CN | 106532412 A | 3/2017 |
| CN | 107069421 A | 8/2017 |
| CN | 107210574 A | 9/2017 |
| CN | 107851957 A | 3/2018 |
| CN | 106452158 B | 12/2018 |
| CN | 109478757 A | 3/2019 |
| JP | H07-245549 A | 9/1995 |
| JP | 2001-217492 A | 8/2001 |
| JP | 2004-064935 A | 2/2004 |
| JP | 2004-087645 A | 3/2004 |
| JP | 2004-242409 A | 8/2004 |
| JP | 2005-130576 A | 5/2005 |
| JP | 2005-347586 A | 12/2005 |
| JP | 2016-506616 A | 3/2016 |
| TW | 393816 B | 6/2000 |
| WO | 2016/152738 A1 | 9/2016 |

OTHER PUBLICATIONS

How transformed core are used in the word (Year: 2024).*
A Search Report issued by the China National Intellectual Property Administration on Feb. 20, 2024, which corresponds to Chinese Patent Application 201980091035.1 and is related to U.S. Appl. No. 17/397,375.
International Search Report issued in PCT/JP2019/012902; mailed Jun. 25, 2019.
International Preliminary Report On Patentability and Written Opinion issued in PCT/JP2019/012902; issued Sep. 28, 2021.
An Office Action issued by the Chinese National Intellectaul Property Administration on Oct. 7, 2023, which corresponds to Chinese Patent Application No. 201980091035.1 and is related to U.S. Appl. No. 17/397,375.

* cited by examiner

HIGH-VOLTAGE PULSE GENERATOR, GAS LASER APPARATUS, AND METHOD FOR MANUFACTURING ELECTRONIC DEVICE

CROSS-REFERENCE TO RELATED APPLICATIONS

The present application is a continuation application of International Application No. PCT/JP2019/012902, filed on Mar. 26, 2019, the entire contents of which are hereby incorporated by reference.

BACKGROUND

1. Technical Field

The present disclosure relates to a high-voltage pulse generation device, a gas laser apparatus, and a method for manufacturing an electronic device.

2. Related Art

A semiconductor exposure apparatus is required to improve the resolution thereof as a semiconductor integrated circuit is increasingly miniaturized and highly integrated. The semiconductor exposure apparatus is hereinafter referred simply to as an "exposure apparatus". To improve the resolution, reduction in the wavelength of light output from a light source for exposure is underway. A gas laser apparatus is used as the light source for exposure in place of a mercury lamp in related art. At present, a KrF excimer laser apparatus, which is configured to output ultraviolet light having a wavelength of 248 nm, and an ArF excimer laser apparatus, which is configured to output ultraviolet light having a wavelength of 193 nm, are used as the gas laser apparatus for exposure.

As a current exposure technology, liquid-immersion exposure, in which the gap between a projection lens of the exposure apparatus and a wafer is filled with a liquid, has been put into use. In the liquid-immersion exposure, since the refractive index of the gap between the projection lens and the wafer changes, the apparent wavelength of the light from the light source for exposure shortens. In the liquid-immersion exposure with an ArF excimer laser apparatus as the light source for exposure, a wafer is irradiated with ultraviolet light having an in-water wavelength of 134 nm. The technology described above is called ArF liquid-immersion exposure. The ArF liquid-immersion exposure is also called ArF liquid-immersion lithography.

Since KrF and ArF excimer laser apparatuses each have a wide spectral linewidth ranging from about 350 to 400 pm in spontaneous oscillation, the chromatic aberrations occur in association with laser light (ultraviolet light) projected with the size thereof reduced onto the wafer via the projection lens of the exposure apparatus, resulting in a decrease in the resolution. To avoid the decrease in the resolution, the spectral linewidth of the laser light output from the gas laser apparatus needs to be narrow enough to make the chromatic aberrations negligible. The spectral linewidth is also called a spectral width. To achieve a narrow spectral linewidth, a line narrowing module including a line narrowing element is provided in a laser resonator of the gas laser apparatus, and the line narrowing module narrows the spectral width. The line narrowing element may, for example, be an etalon or a grating. A laser apparatus providing a narrowed spectral width described above is called a narrowed-line laser apparatus.

CITATION LIST

Patent Literature

[PTL 1] US Patent Application Publication No. 2017/0338618
[PTL 2] JP-A-07-245549
[PTL 3] U.S. Pat. No. 5,568,226

SUMMARY

A high-voltage pulse generation device according to a viewpoint of the present disclosure is a high-voltage pulse generation device configured to apply a pulsed high voltage to a space between a pair of discharge electrodes disposed in a laser chamber of a gas laser apparatus, the high-voltage pulse generation device including n transformer cores that form a transformer, where n is a natural number greater than or equal to two, n primary electric circuits of the transformer, the n primary electric circuits each having a first terminal connected to a reference potential and a second terminal connected to a charger, the n primary electric circuits each including one or more primary coils, one or more diodes connected in parallel to the one or more primary coils, and one or more pulse generators connected in parallel to the one or more primary coils, and a secondary electric circuit of the transformer, the secondary electric circuit including a secondary coil and connected to the pair of discharge electrodes.

A gas laser apparatus according to another viewpoint of the present disclosure is a gas laser apparatus including a laser chamber, a pair of discharge electrodes disposed in the laser chamber, and a high-voltage pulse generation device configured to apply a pulsed high voltage to a space between the pair of discharge electrodes. The high-voltage pulse generation device is a high-voltage pulse generation device configured to apply the pulsed high voltage to the space between the pair of discharge electrodes disposed in the laser chamber of the gas laser apparatus, the high-voltage pulse generation device including n transformer cores that form a transformer, where n is a natural number greater than or equal to two, n primary electric circuits of the transformer, the n primary electric circuits each having a first terminal connected to a reference potential and a second terminal connected to a charger, the n primary electric circuits each including one or more primary coils, one or more diodes connected in parallel to the one or more primary coils, and one or more pulse generators connected in parallel to the one or more primary coils, and a secondary electric circuit of the transformer, the secondary electric circuit including a secondary coil and connected to the pair of discharge electrodes.

A method for manufacturing an electronic device according to another viewpoint of the present disclosure includes generating pulsed laser light by using a gas laser apparatus, outputting the pulsed laser light to an exposure apparatus, and exposing a photosensitive substrate to the pulsed laser light in the exposure apparatus to manufacture the electronic device. The gas laser apparatus is a gas laser apparatus including a laser chamber, a pair of discharge electrodes disposed in the laser chamber, and a high-voltage pulse generation device configured to apply a pulsed high voltage to a space between the pair of discharge electrodes. The high-voltage pulse generation device is a high-voltage pulse generation device configured to apply the pulsed high voltage to the space between the pair of discharge electrodes disposed in the laser chamber of the gas laser apparatus, the high-voltage pulse generation device including n transformer cores that form a transformer, where n is a natural number greater than or equal to two, n primary electric circuits of the transformer, the n primary electric circuits each having a first terminal connected to a reference potential and a second terminal connected to a charger, the n primary electric circuits each including one or more primary coils, one or more diodes connected in parallel to the one or more primary coils, and one or more pulse generators connected in parallel to the one or more primary coils, and a secondary electric circuit of the transformer, the secondary electric circuit including a secondary coil and connected to the pair of discharge electrodes.

BRIEF DESCRIPTION OF THE DRAWINGS

Embodiments of the present disclosure will be described below only by way of example with reference to the accompanying drawings.

DETAILED DESCRIPTION

Contents

Figure 1:
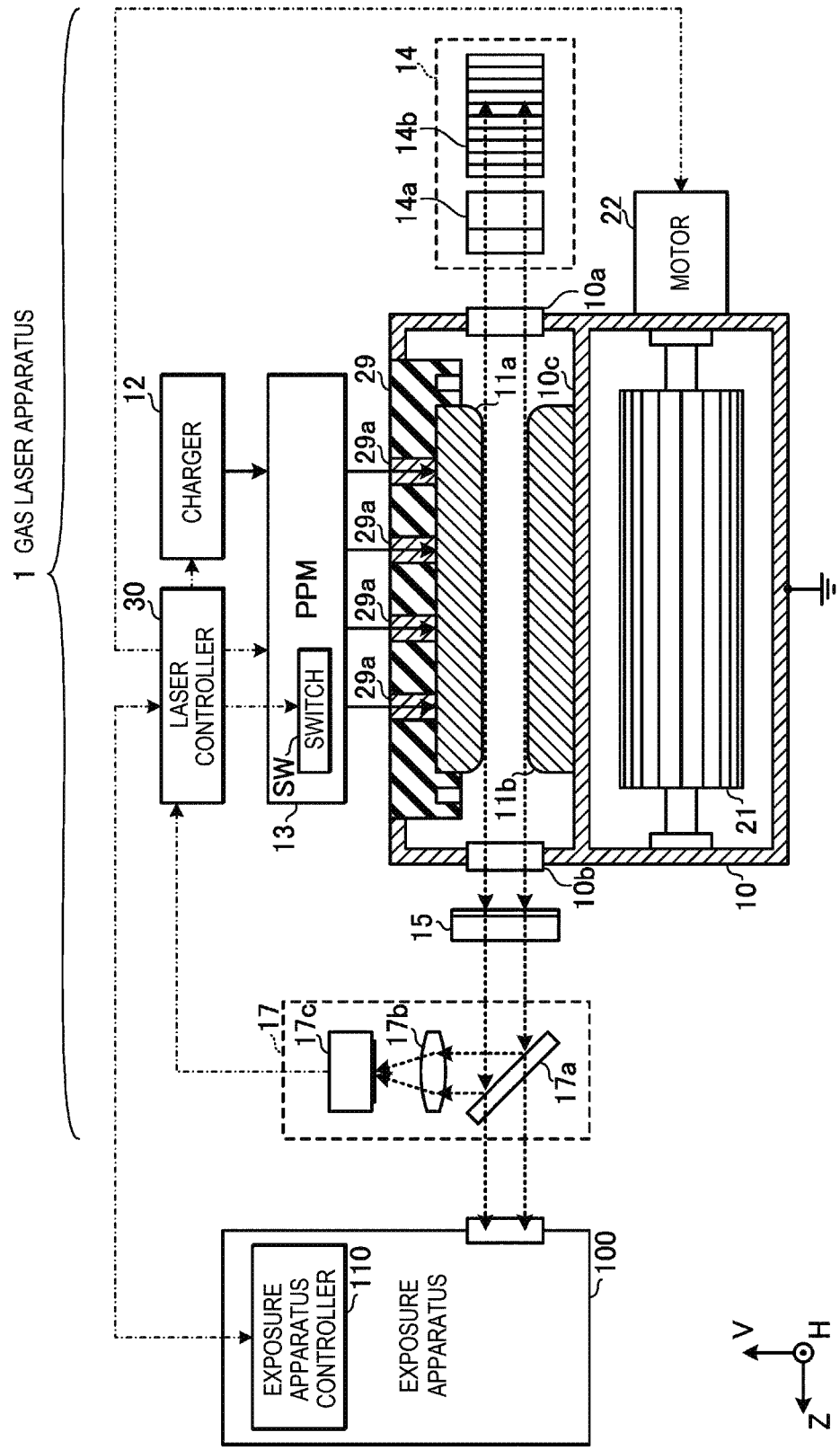
FIG. 1 diagrammatically shows the configuration of a gas laser apparatus 1 according to Comparative Example.

1. Comparative Example
1.1 Configuration of gas laser apparatus
1.2 Operation of gas laser apparatus
1.3 Configuration of pulse power module
1.3.1 Primary electric circuits
1.3.2 Secondary electric circuit
1.4 Operation of pulse power module
1.5 Operation of laser controller
1.5.1 Main procedure
1.5.2 Details of drive timing setting
1.5.2.1 Primary electric circuits driven at time T1
1.5.2.2 Primary electric circuits driven at time T2
1.5.2.3 Primary electric circuits driven at time T3
1.5.2.4 Primary electric circuits not to be driven
1.5.3 Time chart
1.6 Problems
2. Pulse power module with diodes disposed in primary electric circuits
2.1 Configuration
2.2 Operation
2.3 Effects
3. Pulse power module mounted on circular substrate
4. Pulse power module in which n primary electric circuits are stacked
5. Pulse power module disposed in laser chamber
6. Pulse power module with transformer cores elongated in direction Z
6.1 Configuration of transformer cores
6.2 Configuration of secondary coil
6.3 Configuration of m pulse generators
6.4 Effects
7. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparative Example

1.1 Configuration of Gas Laser Apparatus

FIG. 1 diagrammatically shows the configuration of a gas laser apparatus 1 according to Comparative Example. FIG. 1 shows the internal configuration of the gas laser apparatus 1 viewed in a direction approximately perpendicular to the direction of the discharge between a pair of discharge electrodes 11a and 11b and approximately perpendicular to the traveling direction of laser light output via an output coupling mirror 15. The traveling direction of the laser light output via the output coupling mirror 15 is called a direction +Z. The direction of the discharge between the discharge electrodes 11a and 11b is called a direction +V or a direction −V. The direction perpendicular to both of the directions described above is called a direction +H or a direction −H. The direction Z corresponds to the first direction in the present disclosure. The direction H corresponds to the second direction in the present disclosure. The direction −V approximately coincides with the direction of gravity. The direction −V corresponds to the third direction in the present disclosure. The direction +V corresponds to the fourth direction in the present disclosure.

The gas laser apparatus 1 is used with an exposure apparatus 100. Laser light output from the gas laser apparatus 1 enters the exposure apparatus 100. The exposure apparatus 100 includes an exposure apparatus controller 110. The exposure apparatus controller 110 is configured to control the exposure apparatus 100. The exposure apparatus controller 110 is configured to transmit setting data on target pulse energy Et and an oscillation trigger signal to a laser controller 30 provided in the gas laser apparatus 1.

The gas laser apparatus 1 includes a laser chamber 10, a charger 12, a pulse power module 13, a line narrowing module 14, the output coupling mirror 15, an energy monitor 17, a crossflow fan 21, a motor 22, and the laser controller 30. The gas laser apparatus 1 is, for example, an excimer laser apparatus. The laser controller 30 is configured to oversee the control of the entire gas laser apparatus 1.

The laser chamber 10 is disposed in an optical path of a laser resonator formed by the line narrowing module 14 and the output coupling mirror 15. The laser chamber 10 is provided with two windows 10a and 10b. The laser chamber 10 is configured to house the discharge electrodes 11a and 11b. The laser chamber 10 is further configured to house a laser gas as a laser medium. The laser gas contains, for example, an argon gas, a fluorine gas, and a neon gas. The laser gas instead contains, for example, a krypton gas, a fluorine gas, and a neon gas.

An opening is formed at part of the laser chamber 10, and the opening is closed by an insulator 29. The insulator 29 is configured to support the discharge electrode 11a. A plurality of conductors 29a are buried in the insulator 29. The conductors 29a are each electrically connected to the discharge electrode 11a.

A return plate 10c is disposed in the laser chamber 10. A conductive member of the laser chamber 10 is electrically connected to the return plate 10c. The return plate 10c is configured to support the discharge electrode 11b. The return plate 10c is electrically connected to the discharge electrode 11b. There are gaps that are not shown but are located between the laser chamber 10 and the return plate 10c, a gap on the far side and a gap on the near side of the plane of view of FIG. 1, and the laser gas passes through the gaps.

The crossflow fan 21 is disposed in the laser chamber 10. A rotary shaft of the crossflow fan 21 is connected to the motor 22 disposed outside the laser chamber 10. The motor 22 is configured to rotate the crossflow fan 21. The laser gas thus circulates in the laser chamber 10.

The charger 12 is configured to retain electrical energy to be supplied to the pulse power module 13. The pulse power module 13 includes a switch SW. The charger 12 is connected to the pulse power module 13. The pulse power module 13 is connected to the discharge electrode 11a via the conductors 29a.

The line narrowing module 14 includes a wavelength selector, such as a prism 14a and a grating 14b. The line narrowing module 14 may be replaced with a high reflection mirror.

The output coupling mirror 15 is formed of a partial reflection mirror.

The energy monitor 17 includes a beam splitter 17a, a condenser lens 17b, and an optical sensor 17c. The beam splitter 17a is disposed in an optical path of the laser light output via the output coupling mirror 15. The beam splitter 17a is configured to transmit part of the laser light output via the output coupling mirror 15 at high transmittance toward the exposure apparatus 100 and reflect the other part of the laser light. The condenser lens 17b and the optical sensor 17c are disposed in an optical path of the laser light reflected off the beam splitter 17a.

1.2 Operation of Gas Laser Apparatus

The laser controller 30 is configured to receive the setting data on the target pulse energy Et and the oscillation trigger signal from the exposure apparatus controller 110. The laser controller 30 is configured to transmit a charging voltage setting signal to the charger 12 based on the setting data on the target pulse energy Et received from the exposure apparatus controller 110. The laser controller 30 is further configured to transmit the oscillation trigger signal received from the exposure apparatus controller 110 to the pulse power module 13.

Upon receipt of the oscillation trigger signal from the laser controller 30, the pulse power module 13 is configured to generate pulsed high voltage from the electrical energy charged in the charger 12 and applies the high voltage to the space between the discharge electrodes 11a and 11b.

When the high voltage is applied to the space between the discharge electrodes 11a and 11b, discharge occurs between the discharge electrodes 11a and 11b. The energy of the discharge excites the laser gas in the laser chamber 10, and the excited laser gas transitions to a high energy level. Thereafter, when the excited laser gas transitions to a low energy level, the laser gas emits light having a wavelength according to the difference between the energy levels.

The light generated in the laser chamber 10 exits out of the laser chamber 10 via the windows 10a and 10b. The light having exited via the window 10a of the laser chamber 10 is enlarged in terms of beam width by the prism 14a and is then incident on the grating 14b. The light incident from the prism 14a on the grating 14b is reflected off and diffracted by a plurality of grooves of the grating 14b in the direction corresponding to the wavelength of the light. The grating 14b is disposed in the Littrow arrangement, which causes the angle of incidence of the light incident from the prism 14a on the grating 14b to be equal to the angle of diffraction of the diffracted light having a desired wavelength. Light having wavelengths close to the desired wavelength thus returns into the laser chamber 10 via the prism 14a.

The output coupling mirror 15 is configured to transmit and output part of the light having exited via the window 10b of the laser chamber 10 and reflect the other part of the light back into the laser chamber 10.

The light output from the laser chamber 10 thus travels back and forth between the line narrowing module 14 and the output coupling mirror 15. The light is amplified whenever passing through the discharge space between the discharge electrodes 11a and 11b. The light undergoes the line narrowing operation whenever deflected back by the line narrowing module 14. The light thus having undergone the laser oscillation and the line narrowing operation is output as the laser light via the output coupling mirror 15.

The condenser lens 17b provided in the energy monitor 17 is configured to focus the laser light reflected off the beam splitter 17a onto the optical sensor 17c. The optical sensor 17c is configured to transmit an electrical signal according to the pulse energy of the laser light focused by the condenser lens 17b as measured data to the laser controller 30.

The laser controller 30 is configured to receive the measured data from the energy monitor 17. The laser controller 30 is configured to perform feedback control on the charging voltage to be set in the charger 12 based on the pulse energy measured data received from the energy monitor 17 and the setting data on the target pulse energy Et received from the exposure apparatus controller 110.

1.3 Configuration of Pulse Power Module

Figure 2:
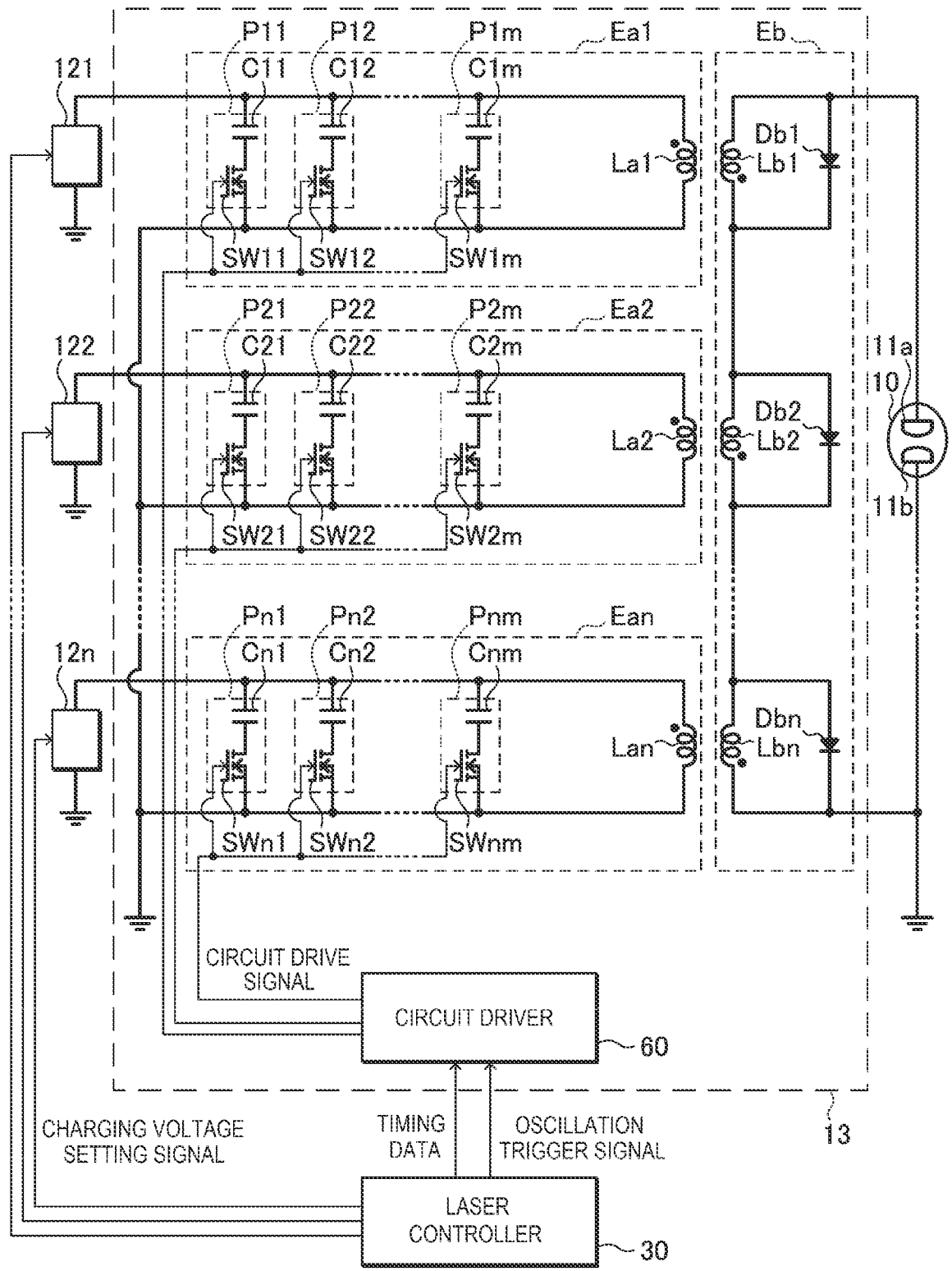
FIG. 2 shows an electric circuit of a pulse power module 13 shown in FIG. 1.

FIG. 2 shows an electric circuit of the pulse power module 13 shown in FIG. 1. The pulse power module 13 in Comparative Example includes n primary electric circuits Ea1 to Ean, a secondary electric circuit Eb, and a circuit driver 60. The pulse power module 13 is a pulse compression circuit formed of a linear transformer driver (LTD). The pulse power module 13 is connected to the laser controller 30 via signal lines.

1.3.1 Primary Electric Circuits

The charger 12 described with reference to FIG. 1 is formed of n chargers 121 to 12n, as shown in FIG. 2. The n chargers 121 to 12n are connected to the n primary electric circuits Ea1 to Ean, respectively. The parameter n represents a natural number greater than or equal to 2, for example, a natural number ranging from 15 to 30. Each charger 12i of the n chargers 121 to 12n is a DC power supply. The parameter i is an arbitrary natural number greater than or equal to 1 but smaller than or equal to n. In the present disclosure, the reference characters of n components X are numbered 1 to n in some cases so that the n components X1 to Xn are distinguished from one another. A reference character Xi may be used as a substitute for one of the n components X1 to Xn. When a reference character Yi is used as a substitute for one of n components Y1 to Yn, which differ from the n components X1 to Xn, it is assumed that the components Xi correspond to the components Yi. Each primary electric circuit Eai of the n primary electric circuits Ea1 to Ean has one terminal connected to a reference potential and another terminal connected to the charger 12i. That is, the n primary electric circuits Ea1 to Ean are connected in parallel with each other. The reference potential is, for example, a ground potential.

The n chargers 121 to 12n are connected to the laser controller 30 via signal lines.

The primary electric circuit Eai includes a primary coil Lai and m pulse generators Pi1 to Pim. That is, the n primary electric circuits Ea1 to Ean include n primary coils La1 to Lan and n×m pulse generators each expressed by a reference character Pij. The parameter m is a natural number greater than or equal to 2, for example, a natural number ranging from 15 to 30. The parameter j is an arbitrary natural number greater than or equal to 1 but smaller than or equal to m. In the present disclosure, the reference characters of m components X are numbered 1 to m in some cases so that the m component X1 to Xm are distinguished from one another. A reference character Xj may be used as a substitute for one of the m components X1 to Xm. When a reference character Yj is used as a substitute for one of m components Y1 to Ym, which differ from the m components X1 to Xm, it is assumed that the components Xj correspond to the components Yj. In the present disclosure, the reference characters of n×m components X are numbered 11 to nm in some cases so that the n×m components X11 to Xnm are distinguished from one another. A reference character Xij may be used as a substitute for one of the n×m components X11 to Xnm. When a reference character Yij is used as a substitute for one of n×m components Y11 to Ynm, which differ from the n×m components X11 to Xnm, it is assumed that the components Xij correspond to the components Yij.

The pulse generator Pij includes a capacitor Cij and a switch SWij. The capacitor Cij and the switch SWij are connected in series to each other.

In the primary electric circuit Eai, the m pulse generators Pi1 to Pim are connected in parallel to each other. Further, the primary coil Lai is connected in parallel to the m pulse generators Pi1 to Pim. Out of the terminals at opposite ends of the primary coil Lai, one terminal is connected to the reference potential, and the other terminal is connected to the output terminal of the charger 12i. Out of the terminals at opposite ends of the pulse generator Pij, the terminal located on the side facing the switch SWij is connected to the reference potential, and the terminal located on the side facing the capacitor Cij is connected to the output terminal of the charger 12i.

The switch SWij is formed, for example, of a MOSFET (metal-oxide-semiconductor field-effect transistor). The drain terminal of the MOSFET that forms the switch SWij is connected to one terminal of the capacitor Cij. The source terminal of the MOSFET is connected to the reference potential. The gate terminal of the MOSFET is connected to the circuit driver 60 by a signal line.

Signal lines are connected to the circuit driver 60, and the number of signal lines is n. The n signal lines are connected to the n primary electric circuits Ea1 to Ean. The n signal lines each branch into m signal lines. The m signal lines are connected to m switches SWi1 to SWim provided in the primary electric circuit Eai. That is, the m signal lines are connected to the m gate terminals of the m MOSFETs.

1.3.2 Secondary Electric Circuit

One terminal of the secondary electric circuit Eb is connected to the discharge electrode 11a. Another terminal of the secondary electric circuit Eb and the discharge electrode 11b are both connected to the reference potential.

The secondary electric circuit Eb includes n secondary coils Lb1 to Lbn and n diodes Db1 to Dbn. The n secondary coils Lb1 to Lbn are connected in series with each other. The n diodes Db1 to Dbn are connected in parallel to the n secondary coils Lb1 to Lbn, respectively.

The n primary coils La1 to Lan, the n secondary coils Lb1 to Lbn, and n transformer cores TC1 to TCn (see FIGS. 8A to 11B) form a transformer. The n transformer cores TC1 to TCn and each transformer core TCi will be described later.

1.4 Operation of Pulse Power Module

The laser controller 30 is configured to transmit the charging voltage setting signal to the n chargers 121 to 12n. For example, approximately the same charging voltage ΔV is set in the n chargers 121 to 12n. The charging voltage ΔV is, for example, a voltage that is positive with respect to the reference potential. The charging voltage ΔV may, for example, be about 1 kV. Each charger 12i of the n chargers 121 to 12n charges m capacitors Ci1 to Cim provided in the primary electric circuit Eai with the charging voltage ΔV.

The laser controller 30 is configured to output timing data and the oscillation trigger signal to the circuit driver 60. The timing data is data configured to specify the drive timing for each of the n primary electric circuits Ea1 to Ean. The timing data may contain information configured to specify primary electric circuits to be driven out of the n primary electric circuits Ea1 to Ean and those not to be driven. The number of primary electric circuits to be driven out of the n primary electric circuits Ea1 to Ean and specific primary electric circuits to be driven may be determined based on the target pulse energy Et of the pulsed laser light to be output from the gas laser apparatus 1.

The circuit driver 60 is configured to transmit a circuit drive signal to the primary electric circuit Eai based on the timing data and the oscillation trigger signal. The circuit drive signal is input almost simultaneously to the m switches SWi1 to SWim provided in the primary electric circuit Eai. When the states of the m switches SWi1 to SWim are changed from the off state to the on state at almost the same time, a pulsed current flows from the m capacitors Ci1 to Cim at almost the same time. The pulsed current flowing from the m capacitors Ci1 to Cim flows into the primary coil Lai. The pulsed current flows in the primary coil Lai from the upper side to the lower side in FIG. 2. The pulsed current flowing in the primary coil Lai generates a magnetic flux in the transformer core TCi, which will be described later, and the generated magnetic flux generates an induced electromotive force in a secondary coil Lbi.

The induced electromotive force generated in the secondary coil Lbi causes a pulsed voltage to be applied to the space between the pair of discharge electrodes 11a and 11b. Assuming that the ratio of the number of turns between the primary coil Lai and the secondary coil Lbi is one, the induced electromotive force generated in the secondary coil Lbi is approximately equivalent to the charging voltage $\Delta V$ provided by the charger 12i. When a large number of primary electric circuits are driven simultaneously out of the n primary electric circuits Ea1 to Ean, the induced electromotive force is simultaneously generated in a large number of secondary coils out of the n secondary coils Lb1 to Lbn. For example, let i be the number of primary electric circuits simultaneously driven out of the n primary electric circuits Ea1 to Ean, and the voltage applied to the space between the pair of discharge electrodes 11a and 11b is $i \cdot \Delta V$.

When the voltage is applied to the space between the pair of discharge electrodes 11a and 11b and dielectric breakdown occurs, discharge occurs between the pair of discharge electrodes 11a and 11b, and a pulsed current flows in the secondary electric circuit Eb. When the primary coil Lai and the secondary coil Lbi operate in opposite phases, as shown in FIG. 2, the pulsed current flows in the secondary coil Lbi from the upper side to the lower side in FIG. 2. When the discharge occurs, the laser gas is excited, so that the pulsed laser light is generated.

For example, when the primary electric circuit Ea1 is not driven and the remaining n−1 primary electric circuits Ea2 to Ean are driven, induced electromotive forces are simultaneously generated in n−1 secondary coils Lb2 to Lbn. When the diode Db1 is not provided, a large pulsed current flows also in the remaining secondary coil Lb1, which is connected in series to the n−1 secondary coils Lb2 to Lbn. The pulsed current flowing in the secondary coil Lb1 generates a magnetic flux in the transformer core TC1, which will be described later, and the generated magnetic flux generates an induced electromotive force in the primary coil La1. The induced electromotive force generated in the primary coil La1 applies a voltage to m off-state switches SW11 to SWim provided in the primary electric circuit Ea1, and the applied voltage may damage the switches SW11 to SWim. The induced electromotive force generated in the primary coil La1 also applies the voltage to the charger 121, and the applied voltage may damage the charger 121. The diode Db1 is provided to suppress the damage to the switches SW11 to SWim and the charger 121. That is, even when an induced electromotive force is generated in any of the n−1 secondary coils Lb2 to Lbn, the current flows into the diode Db1, which prevents the current from flowing in the secondary coil Lb1.

The same applies to the diodes Db2 to Dbn. That is, even when an induced electromotive force is generated in any of the n secondary coils Lb1 to Lbn other than the secondary coil Lbi, the current flows into diode Dbi, which prevents the current from flowing in the secondary coil Lbi.

1.5 Operation of Laser Controller 1.5.1 Main Procedure

Figure 3:
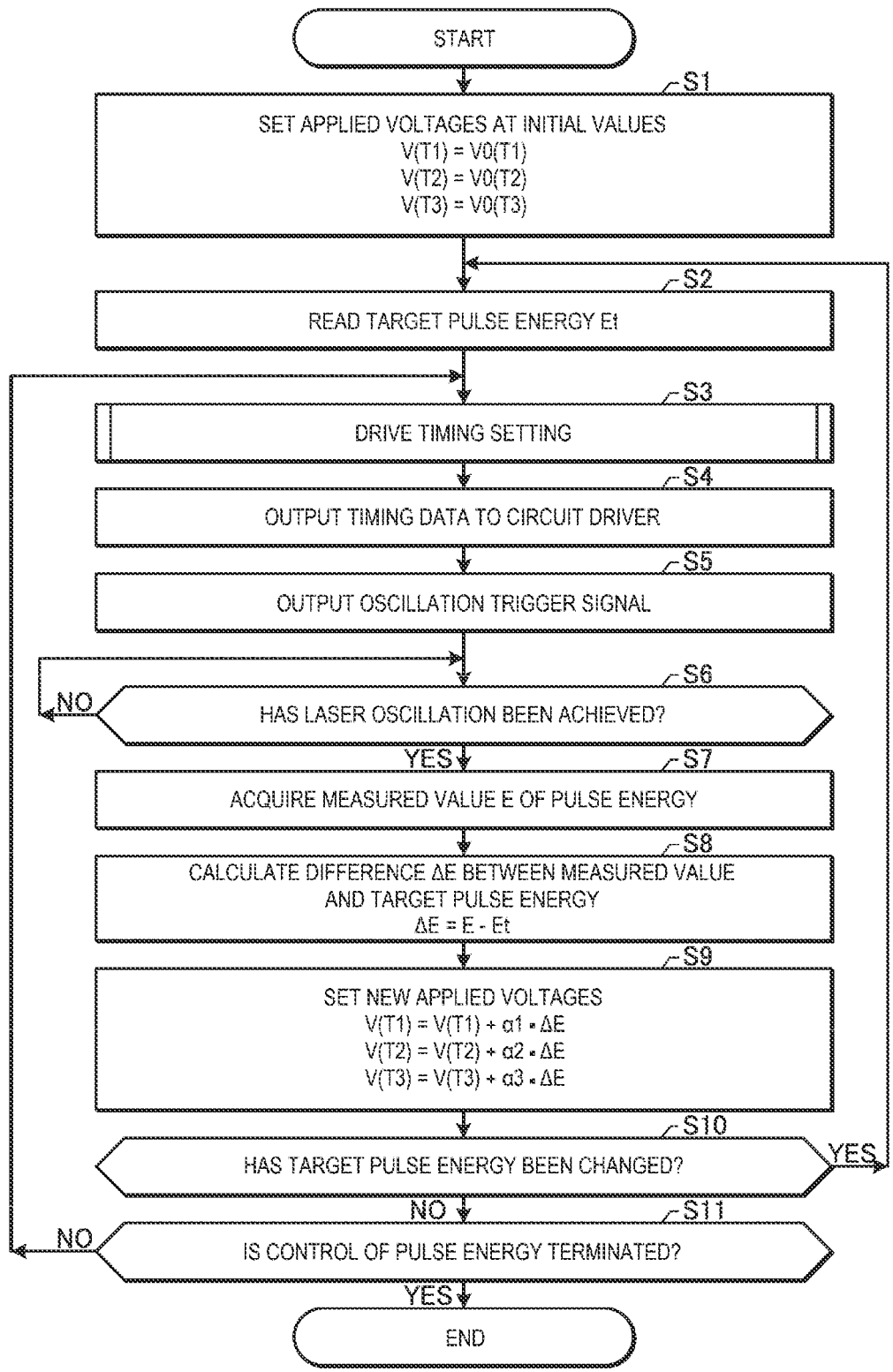
FIG. 3 is a flowchart showing the process in accordance with which a laser controller 30 controls the pulse energy of pulsed laser light.

FIG. 3 is a flowchart showing the process in accordance with which the laser controller 30 controls the pulse energy of the pulsed laser light.

In S1, the laser controller 30 sets voltages V(T1), V(T2), and V(T3) applied to the space between the pair of discharge electrodes 11a and 11b as follows:

$$V(T1)=V0(T1)$$

$$V(T2)=V0(T2)$$

$$V(T3)=V0(T3)$$

The applied voltages V(T1), V(T2), and V(T3) are voltages applied to the space between the pair of discharge electrodes 11a and 11b at the timings delayed by times T1, T2, and T3, respectively, from the time when the oscillation trigger signal is received. V0(T1), V0(T2), and V0(T3) are initial values of the applied voltages V(T1), V(T2), and V(T3), respectively.

The times T1 to T3 have the following relationship:

$$T1<T2<T3$$

The time T3 is a time shorter than or equal to the time for which the discharge necessary for output of pulsed laser light having desired pulse energy can last.

Among the applied voltages V(T1), V(T2), and V(T3), the applied voltage V(T1), for example, has a largest absolute value. The applied voltage V(T1) is set at a voltage that causes the laser gas between the pair of discharge electrodes 11a and 11b to undergo at least dielectric breakdown so that primary discharge is initiated. The applied voltages V(T2) and V(T3) are set at voltages that allow continuation of the primary discharge initiated by the applied voltage V(T1).

In S2, the laser controller 30 reads the target pulse energy Et set by the exposure apparatus controller 110.

In S3, the laser controller 30 performs drive timing setting. The drive timing setting is the process of setting the drive timing for each of the n primary electric circuits Ea1 to Ean to create the timing data. The drive timing setting will be described later in detail with reference to FIG. 4.

In S4, the laser controller 30 outputs the timing data created in S3 to the circuit driver 60.

In S5, the laser controller 30 outputs the oscillation trigger signal received from the exposure apparatus controller 110 to the circuit driver 60. The circuit driver 60 controls the operation of driving the n primary electric circuits Ea1 to Ean based on the timing data and oscillation trigger signal. Specifically, the circuit driver 60 may drive primary electric circuits to be driven out of the n primary electric circuits Ea1 to Ean at timings delayed respectively by the times T1, T2, and T3 from the timing when the oscillation trigger signal is received. The number of primary electric circuits to be driven out of the n primary electric circuits Ea1 to Ean and specific primary electric circuits to be driven will be described later with reference to FIG. 4.

In S6, the laser controller 30 evaluates whether or not the laser oscillation has been achieved. When the laser oscillation has not been achieved, the laser controller 30 waits until the laser oscillation is achieved. Once the laser oscillation is achieved, the laser controller 30 transitions to S7.

In S7, the laser controller 30 acquires a measured value E of the pulse energy measured by the energy monitor 17.

In S8, the laser controller 30 calculates a difference ΔE between the measured value E of the pulse energy and the target pulse energy Et. The difference ΔE is calculated by using the following expression.

$$\Delta E = E - Et$$

In S9, the laser controller 30 sets new applied voltages V(T1), V(T2), and V(T3) that cause the difference ΔE to approach zero. The new applied voltages V(T1), V(T2), and V(T3) are set by using the following expressions.

$$V(T1) = V(T1) + \alpha 1 \cdot \Delta E$$

$$V(T2) = V(T2) + \alpha 2 \cdot \Delta E$$

$$V(T3) = V(T3) + \alpha 3 \cdot \Delta E$$

Note that α1, α2, and α3 on the right-hand side of the expressions may be proportional constants, for example, experimentally determined in advance.

In S10, the laser controller 30 evaluates whether the target pulse energy Et has been changed or not. The exposure apparatus controller 110 changes the target pulse energy Et in some cases. In this case, the exposure apparatus controller 110 outputs the setting data on the changed target pulse energy Et to the laser controller 30.

When the target pulse energy Et has been changed (S10: YES), the laser controller 30 returns to S2. When the target pulse energy Et has not been changed (S10: NO), the laser controller 30 transitions to S11.

In S11, the laser controller 30 evaluates whether or not to terminate the process of controlling the pulse energy of the pulsed laser light.

When the laser controller 30 does not terminate the process of controlling the pulse energy of the pulsed laser light (S11: NO), the laser controller 30 returns to S3. When the laser controller 30 terminates the process of controlling the pulse energy of the pulsed laser light (S11: YES), the laser controller 30 terminates the entire process in the flowchart.

1.5.2 Details of Drive Timing Setting

Figure 4:
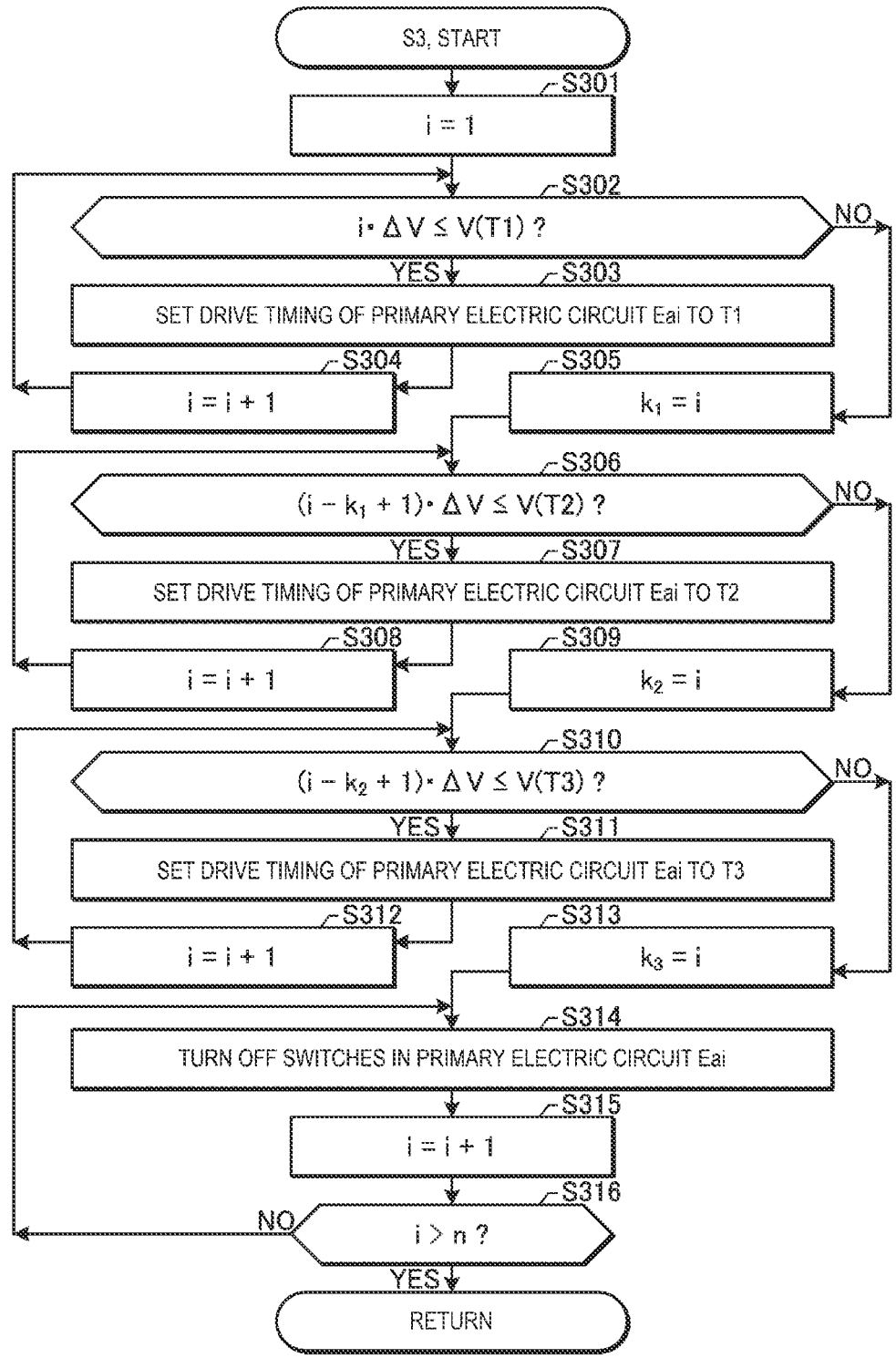
FIG. 4 is a flowchart of a subroutine S3 of drive timing setting in FIG. 3.

FIG. 4 is a flowchart of the subroutine S3 of the drive timing setting in FIG. 3.

In S301, the laser controller 30 sets an identification number i at 1. In the flowchart, it is assumed that when the identification number i is set, one primary electric circuit Eai out of the n primary electric circuits Ea1 to Ean is identified. When the identification number i is set, one charger 12i corresponding to the primary electric circuit Eai is also identified. In the following process, the laser controller 30 sets the drive timing of the primary electric circuit Eai while counting up the identification number i.

1.5.2.1 Primary Electric Circuits Driven at Time T1

In S302, the laser controller 30 evaluates whether the sum of the charging voltages set in i chargers 121 to 12i identified by the identification numbers 1 to i is smaller than or equal to the applied voltage V(T1) or not. The applied voltage V(T1) is the value set in S1 in FIG. 3 as the voltage applied to the space between the pair of discharge electrodes 11a and 11b at time T1. The sum of the charging voltages provided by the i chargers 121 to 12i is expressed by i·ΔV. The evaluation of S302 is therefore performed based on whether the following condition is satisfied or not:

$$i \cdot \Delta V \leq V(T1)$$

When the sum of the charging voltages i·ΔV is not smaller than or equal to the applied voltage V(T1) (S302: NO), the laser controller 30 transitions to S305. When the sum of the charging voltages i·ΔV is smaller than or equal to the applied voltage V(T1) (S302: YES), the laser controller 30 transitions to S303.

In S303, the laser controller 30 sets the drive timing of the primary electric circuit Eai identified by the identification number i to the time T1.

In S304, the laser controller 30 updates the value of the identification number i by adding one thereto. The laser controller 30 then returns to S302.

In S305, the laser controller 30 sets a first threshold value $k_1$ at the value of the current identification number i. $k_1-1$ primary electric circuits Ea1 to $\text{Ea}k_1-1$ identified by identification numbers 1 to $k_1-1$, which are smaller than the first threshold value $k_1$, are the primary electric circuits to be driven at the timing delayed by the time T1 from the time when the oscillation trigger signal is received. Primary electric circuits $\text{Ea}k_1$ to Ean identified by the identification numbers $k_1$ to n, which are greater than or equal to the first threshold value $k_1$, are primary electric circuits not to be driven at the timing delayed by the time T1 from the time when the oscillation trigger signal is received. According to the setting described above, a voltage close to the applied voltage V(T1) can be applied to the space between the pair of discharge electrodes 11a and 11b when the $k_1-1$ primary electric circuits Ea1 to $\text{Ea}k_1-1$ are simultaneously driven.

1.5.2.2 Primary Electric Circuits Driven at Time T2

In S306, the laser controller 30 evaluates whether the sum of the charging voltages provided by $i-k_1+1$ chargers $12k_1$ to 12i identified by the identification numbers $k_1$ to i is smaller than or equal to the applied voltage V(T2). The applied voltage V(T2) is the value set in S1 as the voltage applied to the space between the pair of discharge electrodes 11a and 11b in the time T2. The sum of the charging voltages provided by the $i-k_1+1$ chargers $12k_1$ to 12i is expressed by $(i-k_1+1) \cdot \Delta V$. The evaluation of S306 is therefore performed based on whether the following condition is satisfied or not:

$$(i-k_1+1) \cdot \Delta V \leq V(T2)$$

When the sum of the charging voltages $(i-k_1+1) \cdot \Delta V$ is not smaller than or equal to the applied voltage V(T2) (S306: NO), the laser controller 30 transitions to S309. When the sum of the charging voltages $(i-k_1+1) \cdot \Delta$ is smaller than or equal to the applied voltage V(T2) (S306: YES), the laser controller 30 transitions to S307.

In S307, the laser controller 30 sets the drive timing of the primary electric circuit Eai identified by the identification number i to the time T2.

In S308, the laser controller 30 updates the value of the identification number i by adding one thereto. The laser controller 30 then returns to S306.

In S309, the laser controller 30 sets the value of the current identification number i at a second threshold value $k_2$. $k_2-k_1$ primary electric circuits $\text{Ea}k_1$ to $\text{Ea}k_2-1$ identified by the identification numbers $k_1$ to $k_2-1$, which are greater than or equal to the first threshold value $k_1$ but smaller than the second threshold value $k_2$, are the primary electric circuits to be driven at the timing delayed by the time T2 from the time when the oscillation trigger signal is received. The primary electric circuits Ea1 to $\text{Ea}k_1-1$ and $\text{Ea}k_2$ to Ean identified by the other identification numbers 1 to $k_1-1$ and $k_2$ to n are the primary electric circuits not to be driven at the timing delayed by the time T2 from the time when the oscillation trigger signal is received. According to the setting described above, a voltage close to the applied voltage V(T2) can be applied to the space between the pair of discharge electrodes 11a and 11b when the $k_2$-$k_1$ primary electric circuits $Eak_1$ to $Eak_2$-1 are simultaneously driven.

1.5.2.3 Primary Electric Circuits Driven at Time T3

In S310, the laser controller 30 determines whether the sum of the charging voltages provided by i-$k_2$+1 chargers 12$k_2$ to 12i identified by the identification numbers $k_2$ to i is smaller than or equal to the applied voltage V(T3) or not. The applied voltage V(T3) is the value set in S1 as the voltage applied to the space between the pair of discharge electrodes 11a and 11b in the time T3. The sum of the charging voltages provided by the i-$k_2$+1 chargers 12$k_2$ to 12i is expressed by (i-$k_2$+1)·ΔV. The evaluation of S310 is therefore performed based on whether the following condition is satisfied or not:

$$(i-k_2+1)\cdot \Delta V \le V(T3)$$

When the sum of the charging voltages (i-$k_2$+1)·ΔV is not smaller than or equal to the applied voltage V(T3) (S310: NO), the laser controller 30 transitions to S313. When the sum of the charging voltages (i-$k_2$+1)·ΔV is smaller than or equal to the applied voltage V(T3) (S310: YES), the laser controller 30 transitions to S311.

In S311, the laser controller 30 sets the drive timing of the primary electric circuit Eai identified by the identification number i to the time T3.

In S312, the laser controller 30 updates the value of the identification number i by adding one thereto. The laser controller 30 then returns to S310.

In S313, the laser controller 30 sets the value of the current identification number i at a third threshold value $k_3$. $k_3$-$k_2$ primary electric circuits $Eak_2$ to $Eak_3$-1 identified by the identification numbers $k_2$ to $k_3$-1, which are greater than or equal to the second threshold value $k_2$ but smaller than the third threshold value $k_3$, are the primary electric circuits to be driven at the timing delayed by the time T3 from the time when the oscillation trigger signal is received. The primary electric circuits Ea1 to $Eak_2$-1 and $Eak_3$ to Ean identified by the other identification numbers 1 to $k_2$-1 and $k_3$ to n are the primary electric circuits not to be driven at the timing delayed by the time T3 from the time when the oscillation trigger signal is received. According to the setting described above, a voltage close to the applied voltage V(T3) can be applied to the space between the pair of discharge electrodes 11a and 11b when the $k_3$-$k_2$ primary electric circuits $Eak_2$ to $Eak_3$-1 are simultaneously driven.

1.5.2.4 Primary Electric Circuits not to be Driven

In S314, the laser controller 30 turns off the switches SWi1 to SWim provided in the primary electric circuit Eai having the identification number i. That is, the primary electric circuit Eai having the identification number i is set as the primary electric circuit not to be driven.

In S315, the laser controller 30 updates the value of the identification number i by adding one thereto.

In S316, the laser controller 30 evaluates whether the current identification number i is greater than the number n of primary electric circuits Ea1 to Ean. When the value of the current identification number i is smaller than or equal to the number n of primary electric circuits Ea1 to Ean (S316: NO), the laser controller 30 returns to S314. When the value of the current identification number i is greater than the number n of primary electric circuits Ea1 to Ean (S316: YES), the laser controller 30 terminates the overall process in the flowchart and transitions to S4 in FIG. 3.

The timing data is thus generated.

1.5.3 Time Chart

Figure 5:
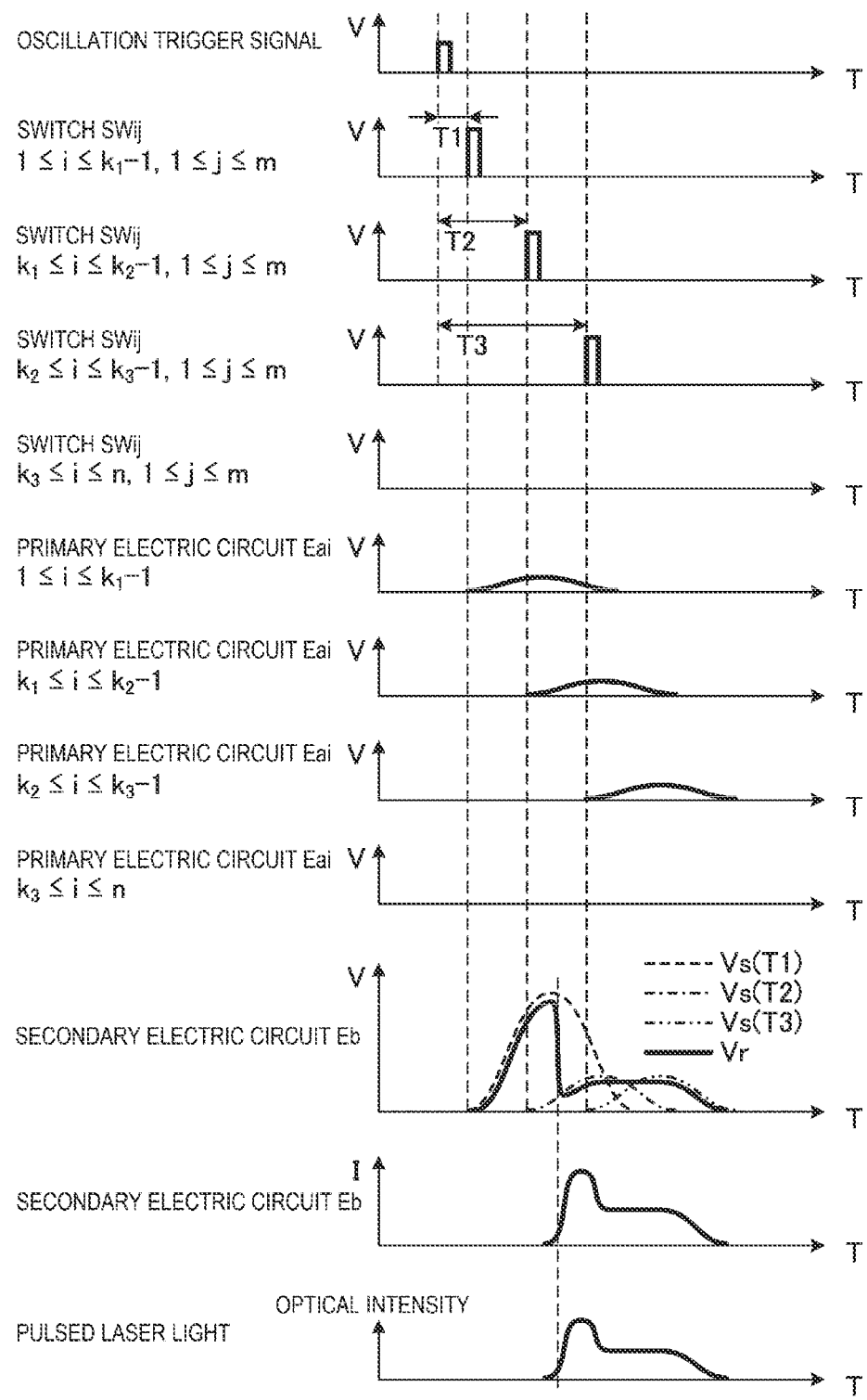
FIG. 5 is a time chart showing waveform control based on the drive timing setting.

FIG. 5 is a time chart showing waveform control based on the drive timing setting. The horizontal axis of FIG. 5 represents the time T. The vertical axis of FIG. 5 represents the intensity of a signal, such as the voltage V.

The laser controller 30 outputs the oscillation trigger signal to the circuit driver 60. The laser controller 30 also outputs the timing data as well as the oscillation trigger signal to the circuit driver 60.

The circuit driver 60 transmits the circuit drive signal to the primary electric circuits Ea1 to $Eak_1$-1 identified by the identification numbers 1 to $k_1$-1 at the timing delayed by the time T1 from the time when the oscillation trigger signal is received. The switches SWij provided in the primary electric circuits Ea1 to $Eak_1$-1 are thus turned on.

The circuit driver 60 transmits the circuit drive signal to the primary electric circuits $Eak_1$ to $Eak_2$-1 identified by the identification numbers $k_1$ to $k_2$-1 at the timing delayed by the time T2 from the time when the oscillation trigger signal is received. The switches SWij provided in the primary electric circuits $Eak_1$ to $Eak_2$-1 are thus turned on.

The circuit driver 60 transmits the circuit drive signal to the primary electric circuits $Eak_2$ to $Eak_3$-1 identified by the identification numbers $k_2$ to $k_3$-1 at the timing delayed by the time T3 from the time when the oscillation trigger signal is received. The switches SWij provided in the primary electric circuits $Eak_2$ to $Eak_3$-1 are thus turned on.

The circuit driver 60 maintains the switches SWij provided in the primary electric circuits $Eak_3$ to Ean identified by the identification numbers $k_3$ to n turned off.

When the switch SWij is turned on in each primary electric circuit Eai of the primary electric circuits Ea1 to $Eak_3$-1, a pulsed voltage having a peak value of the charging voltage ΔV is applied to the opposite ends of the primary coil Lai.

Each primary electric circuit Eai of the primary electric circuits $Eak_3$ to Ean is maintained undriven.

In the $k_1$-1 secondary coils Lb1 to $Lbk_1$-1 provided in the secondary electric circuit Eb, the induced electromotive force generates a voltage Vs(T1) at the timing delayed by the time T1 from the time when the oscillation trigger signal is received. The voltage Vs(T1) corresponds to the sum of the voltages applied to the primary coils La1 to $Lak_1$-1 in the $k_1$-1 primary electric circuits Ea1 to $Eak_1$-1. The peak value of the voltage Vs(T1) is ($k_1$-1)·ΔV.

In the $k_2$-$k_1$ secondary coils $Lbk_1$ to $Lbk_2$-1 provided in the secondary electric circuit Eb, the induced electromotive force generates a voltage Vs(T2) at the timing delayed by the time T2 from the time when the oscillation trigger signal is received. The voltage Vs(T2) corresponds to the sum of the voltages applied to the primary coils $Lak_1$ to $Lak_2$-1 in the $k_2$-$k_1$ primary electric circuits $Eak_1$ to $Eak_2$-1. The peak value of the voltage Vs(T2) is ($k_2$-$k_1$)·ΔV.

In the $k_3$-$k_2$ secondary coils $Lbk_2$ to $Lbk_3$-1 provided in the secondary electric circuit Eb, the induced electromotive force generates a voltage Vs(T3) at the timing delayed by the time T3 from the time when the oscillation trigger signal is received. The voltage Vs(T3) corresponds to the sum of the voltages applied to the primary coils $Lak_2$ to $Lak_3$-1 in the $k_3$-$k_2$ primary electric circuits $Eak_2$ to $Eak_3$-1. The peak value of the voltage Vs(T3) is ($k_3$-$k_2$)·ΔV.

The number $k_1-1$ of primary electric circuits Ea1 to Ea$k_1$-1 driven at the timing of the time T1 is desirably greater than the number $k_2-k_1$ of primary electric circuits Ea$k_1$ to Ea$k_2$-1 driven at the timing of the time T2. The number $k_1-1$ of primary electric circuits Ea1 to Ea$k_1$-1 driven at the timing of the time T1 is desirably greater than the number $k_3-k_2$ of primary electric circuits Ea$k_2$ to Ea$k_3$-1 driven at the timing of the time T3. In this case, the absolute value of the peak value of the voltage Vs(T1) generated in the $k_1-1$ secondary coils Lb1 to Lb$k_1$-1 is higher than the absolute value of the peak value of the voltage Vs(T2) generated in the $k_2-k_1$ secondary coils Lb$k_1$ to Lb$k_2$-1. The absolute value of the peak value of the voltage Vs(T1) generated in the $k_1-1$ secondary coils Lb1 to Lb$k_1$-1 is higher than the absolute value of the peak value of the voltage Vs(T3) generated in the $k_3-k_2$ secondary coils Lb$k_2$ to Lb$k_3$-1.

The pulse waveform of a voltage Vr applied to the space between the pair of discharge electrodes 11a and 11b is approximately similar to the pulse waveform of the voltage Vs(T1) immediately before the dielectric breakdown occurs. When the dielectric breakdown occurs so that the primary discharge starts, the voltage Vr rapidly approaches zero. Thereafter, while the voltages Vs(T2) and Vs(T3) are applied, the voltage Vr does not become zero but is maintained at a voltage that allows the primary discharge to continue.

Immediately after the dielectric breakdown, a current I flowing in the secondary electric circuit Eb peaks. Thereafter, while the primary discharge continues, a current smaller than the peak current I flows in the secondary electric circuit Eb. The primary discharge excites the laser gas so that the laser gas emits light, and the gas laser apparatus 1 outputs the pulsed laser light. The pulse waveform of the pulsed laser light is approximately similar to the pulse waveform of the current flowing in the secondary electric circuit Eb.

The waveform of the pulsed laser light is thus controlled based on the drive timing setting.

1.6 Problems

To place n diodes Db1 to Dbn in n secondary coils Lb1 to Lbn as shown in FIG. 2, a space where the diodes are placed is required in the vicinity of the secondary coils Lb1 to Lbn. The output inductance of the pulse power module 13 increases in some cases when the secondary electric circuit Eb is increased in size to provide the space where the diodes are placed in the vicinity of the secondary coils Lb1 to Lbn. When the output inductance increases, it becomes difficult to steeply raise the current flowing in the secondary electric circuit Eb, so that it becomes difficult in some cases to output pulsed laser light having desired pulse energy.

In the embodiments described below, n diodes Da1 to Dan are disposed in the n primary electric circuits Ea1 to Ean, respectively. The output inductance of the pulse power module 13 can thus be reduced, whereby pulsed laser light having desired pulse energy can be output.

2. Pulse Power Module with Diodes Disposed in Primary Electric Circuits

2.1 Configuration

Figure 6:
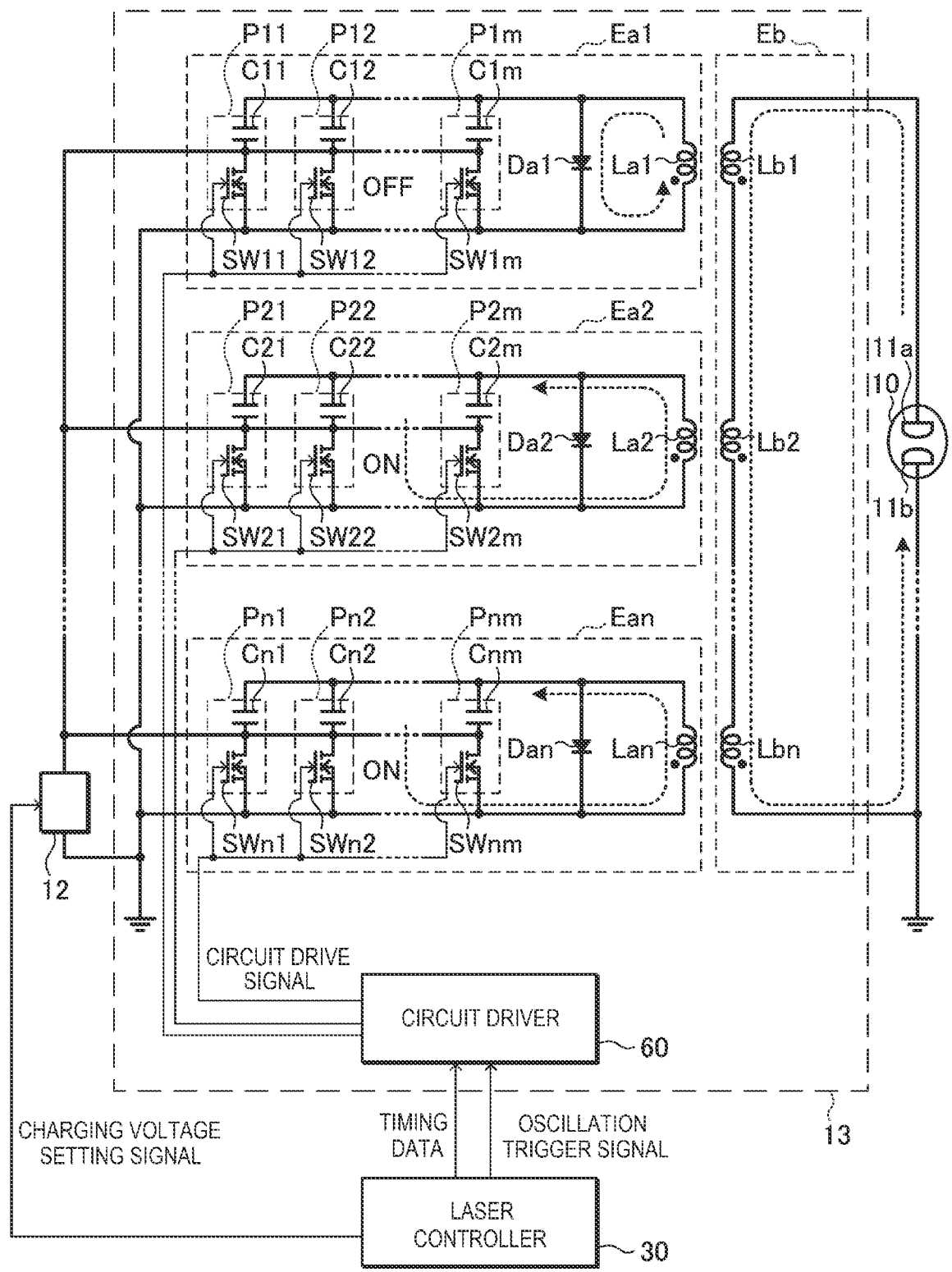
FIG. 6 shows the electric circuit of the pulse power module 13 in a first embodiment of the present disclosure.

FIG. 6 shows the electric circuits of the pulse power module 13 in a first embodiment of the present disclosure. The pulse power module 13 corresponds to the high-voltage pulse generation device according to the present disclosure.

In FIG. 2, the output terminal of the charger 12i is connected to the terminal located on the side facing the capacitor Cij out of the terminals at opposite ends of the pulse generator Pij. In contrast, in the first embodiment, the output terminal of the charger 12 is connected to a point between the capacitor Cij and the switch SWij. The charger 12 may be a common charger connected to the n primary electric circuits Ea1 to Ean. Out of the terminals at opposite ends of the pulse generator Pij, the terminal located on the side facing the switch SWij is connected to the reference potential.

The n diodes Db1 to Dbn described with reference to FIG. 2 may not be provided in the first embodiment. In the first embodiment, the n diodes Da1 to Dan are disposed in the n primary electric circuits Ea1 to Ean, respectively. The n diodes Da1 to Dan are connected in parallel to the n primary coils La1 to Lan provided in the n primary electric circuits Ea1 to Ean, respectively. That is, the diode Dai is connected in parallel to the primary coil Lai provided in the primary electric circuit Eai.

The diode Dai is so connected that the cathode thereof has the reference potential. That is, the anode of the diode Dai has approximately the same potential as the terminal located on the side facing the capacitor Cij out of the terminals at opposite ends of the pulse generator Pij. The cathode of the diode Dai has approximately the same potential as the terminal located on the side facing the switch SWij out of the terminals at opposite ends of the pulse generator Pij.

2.2 Operation

The charger 12 is configured to charge the m capacitors Ci1 to Cim provided in the primary electric circuit Eai with the charging voltage ΔV. Thereafter, when the states of the m switches SWi1 to SWim provided in the primary electric circuit Eai are changed from the off state to the on state at almost the same time, a pulsed current flows from the m capacitors Ci1 to Cim at almost the same time. Since the pulsed current flowing from the m capacitors Ci1 to Cim is a reverse bias current with respect to the diode Dai, no pulsed current flows from the m capacitors Ci1 to Cim to the diode Dai. The pulsed current flowing from the m capacitors Ci1 to Cim flows into the primary coil Lai. The pulsed current flows in the primary coil Lai from the lower side to the upper side in FIG. 6. The pulsed current flowing in the primary coil Lai generates a magnetic flux in the transformer core TCi, which will be described later, and the generated magnetic flux generates an induced electromotive force in the secondary coil Lbi.

A pulsed voltage is applied to the space between the pair of discharge electrodes 11a and 11b when the induced electromotive force is generated in the secondary coil Lbi. When a large number of primary electric circuits are driven simultaneously out of the n primary electric circuits Ea1 to Ean, the induced electromotive force is simultaneously generated in a large number of secondary coils out of the n secondary coils Lbi to Lbn.

When the voltage is applied to the space between the pair of discharge electrodes 11a and 11b so that dielectric breakdown occurs, discharge occurs between the pair of discharge electrodes 11a and 11b, so that a pulsed current flows in the secondary electric circuit Eb. When the primary coil Lai and the secondary coil Lbi operate in the same phase as shown in FIG. 6, the pulsed current flows in the secondary coil Lbi from the upper side to the lower side in FIG. 6. When the discharge occurs, the laser gas is excited, so that the pulsed laser light is generated.

FIG. 6 shows with broken-line arrows the direction of the current generated when the primary electric circuit Ea1 is not driven but the remaining n−1 primary electric circuits Ea2 to Ean are driven. In this case, an induced electromotive force is generated in the n−1 secondary coils Lb2 to Lbn at the same time. A large pulsed current then flows also in the remaining secondary coil Lb1 connected in series to the n−1 secondary coils Lb2 to Lbn. The pulsed current flowing in the secondary coil Lb1 generates a magnetic flux in the transformer core TC1, which will be described later, and the generated magnetic flux generates an induced electromotive force in the primary coil La1.

When the diode Da1 is not provided, the induced electromotive force generated in the primary coil La1 applies a voltage to the m off-state switches SW11 to SW1m provided in the primary electric circuit Ea1, and the applied voltage may damage the switches SW11 to SW1m. The induced electromotive force generated in the primary coil La1 applies the voltage also to the charger 12, and the applied voltage may damage the charger 12. The diode Da1 is provided to suppress the damage to the switches SW11 to SW1m and the charger 12. That is, even when an induced electromotive force is generated in the primary coil La1, the induced electromotive force applies a forward bias voltage to the diode Da1, and a current flows into the diode Da1. Damage to the m off-state switches SW11 to SW1m and the charger 12 is suppressed.

The same applies to the diodes Da2 to Dan. That is, even when an induced electromotive force is generated in one primary coil La*i* out of the n primary coils La1 to Lan, a current flows into the diode Da*i*, so that the m off-state switches SW11 to SW1m and the charger 12 are therefore not damaged.

Figure 7:
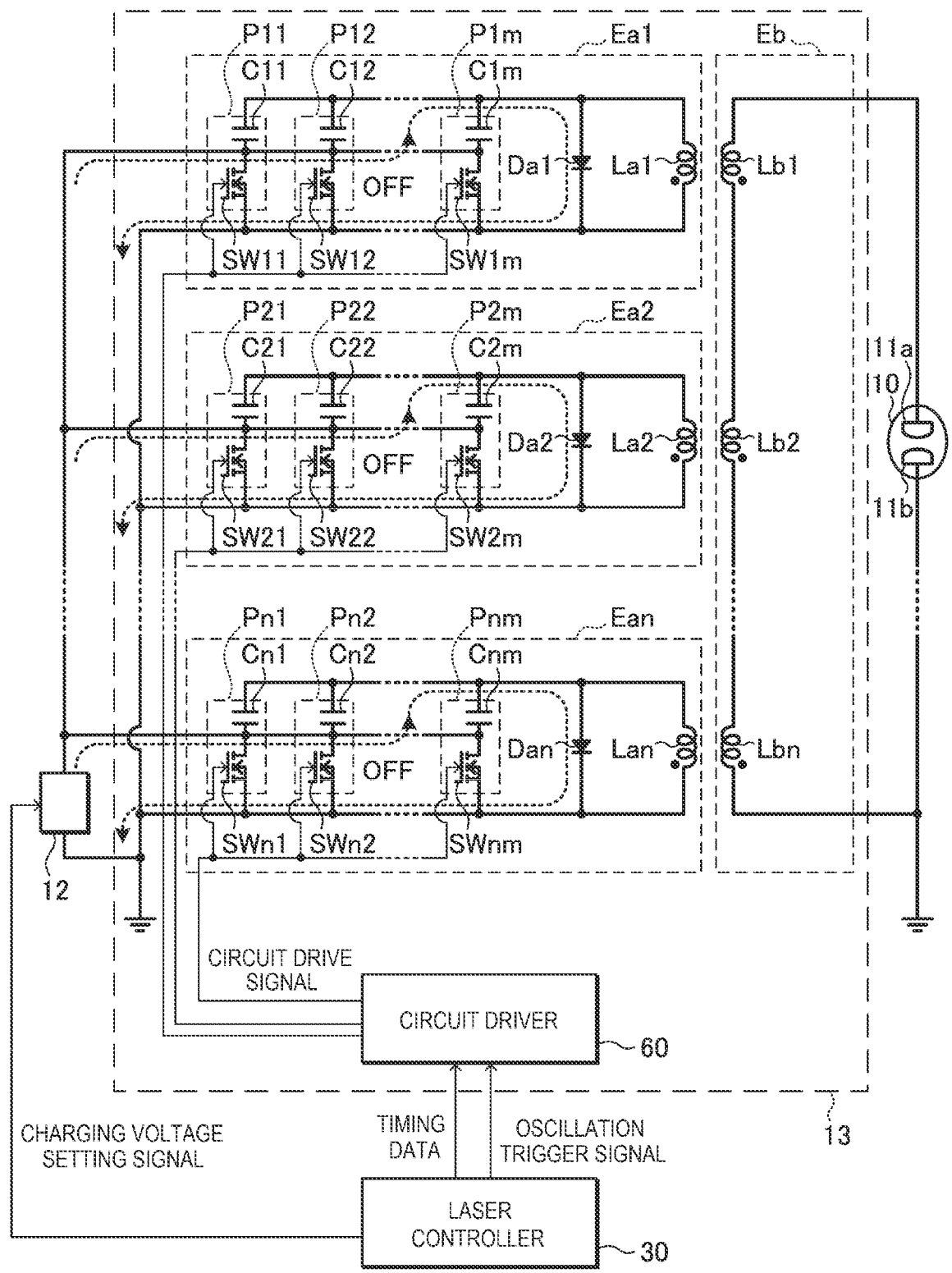
FIG. 7 shows with broken-line arrows a current that flows when a charger 12 charges a capacitor Cij in the same electric circuit shown in FIG. 6.

FIG. 7 shows with broken-line arrows the current that flows when the charger 12 charges the capacitor C*ij* in the same electric circuit shown in FIG. 6. At this point, all the switches SW*ij* operate in the off state. When the charger 12 applies a voltage to the terminal facing the switch SW*ij* out of the terminals of the capacitor C*ij*, a current flows into the terminal facing the switch SW*ij* out of the terminals of the capacitor C*ij* to charge the capacitor C*ij*. At this point, a negative charge flows to the terminal facing away from the switch SW*ij* out of the terminals of the capacitor C*ij*. That is, the current flows out via the terminal facing away from the switch SW*ij* out of the terminals of the capacitor C*ij*. The current flowing out via the terminal facing away from the switch SW*ij* out of the terminals of the capacitor C*ij* passes through the diode Da*i* and is discharged to the reference potential.

2.3 Effects

According to the first embodiment, the diode Da*i* is disposed in the primary electric circuit Ea*i*, whereby the secondary electric circuit Eb can be simplified. The output inductance of the pulse power module 13 can thus be reduced.

Furthermore, for example, when the primary electric circuit Ea1 is not driven and the remaining n−1 primary electric circuits Ea2 to Ean are driven, damage to the switches SW11 to SW1m and the charger 12 can be suppressed.

Moreover, since the current flows into the diode Da*i* when the capacitor C*ij* is charged, the capacitor C*ij* can be efficiently charged. In addition, since the flow of current in the primary coil La*i* can be suppressed during the charging process, generation of a magnetic flux in the transformer core TC*i* can be suppressed, whereby energy loss can be suppressed.

The other points in the first embodiment are the same as those in Comparable Example described above.

3. Pulse Power Module Mounted on Circular Substrate

Figure 8A:
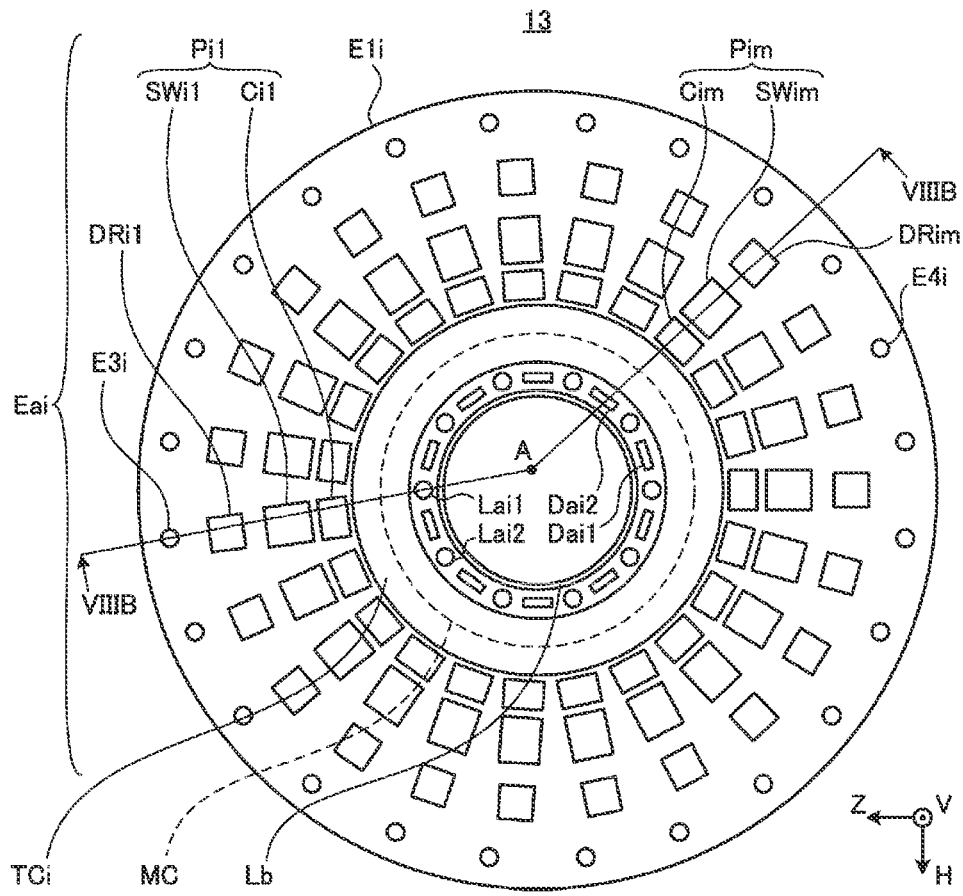
FIG. 8A is a plan view showing a second embodiment in which the pulse power module 13 is mounted on a circular substrate.
Figure 8B:
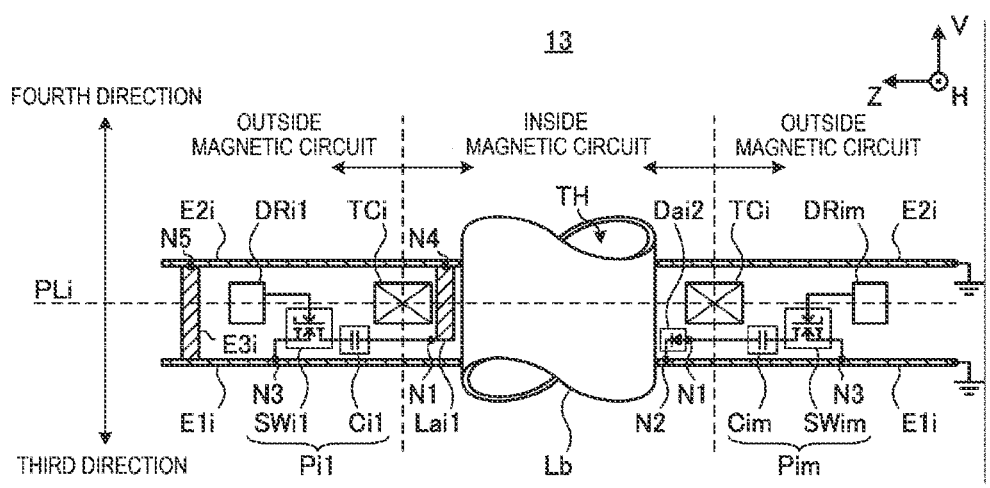
FIG. 8B diagrammatically shows the cross section taken along the line VIIIB-A-VIIIB in FIG. 8A.

FIG. 8A is a plan view showing a second embodiment in which the pulse power module 13 is mounted on a circular substrate. FIG. 8B diagrammatically shows the cross section taken along the line VIIIB-A-VIIIB in FIG. 8A. It is, however, noted that FIG. 8B is not a cross-sectional view of the secondary coil Lb but is a side view thereof. FIGS. 8A and 8B show one primary electric circuit Ea*i* out of the n primary electric circuits Ea1 to Ean, one transformer core TC*i*, and part of the secondary coil Lb.

The transformer core TC*i* has an annular shape. A magnetic circuit MC is formed along the annular shape that forms the transformer core TC*i*, as shown in FIG. 8A. The transformer core TC*i* is located in a first plane PL*i*, as shown in FIG. 8B. The first plane PL*i* is parallel to a plane HZ. The magnetic circuit MC is formed along the first plane PL*i*.

The secondary coil Lb is formed of a conductive member having a cylindrical shape. The secondary coil Lb has a through hole TH, as shown in FIG. 8B. The through hole TH passes through the secondary coil Lb in the direction perpendicular to the first plane PL*i*.

The primary electric circuit Ea*i* includes substrates E1*i* and E2*i* and components mounted on the substrate E1*i*. FIG. 8A does not show the substrate E2*i*. The substrates E1*i* and E2*i* are both parallel to the first plane PL*i*. The transformer core TC*i* is also mounted on the substrate E1*i*. The substrates E1*i* and E2*i* each include a conductive member. The substrates E1*i* and E2*i* are both connected to the reference potential.

The components mounted on the substrate E1*i* include a plurality of primary coils La*i*1 and La*i*2, a plurality of diodes Da*i*1 and Da*i*2, the m pulse generators Pi1 to Pi*m*, m switch drivers DR*i*1 to DR*i*m, and a plurality of conductive members E3*i* and E4*i*. The components mounted on the substrate E1*i*, along with the transformer core TC*i*, are located between the substrates E1*i* and E2*i*. The substrates E1*i* and E2*i* and the transformer core TC*i* each have a through hole, and the secondary coil Lb passes through the through holes in the direction perpendicular to the first plane PL*i*. The m pulse generators Pi1 to Pi*m* and the m switch drivers DR*i*1 to DR*i*m are arranged radially around the transformer core TC*i*, as shown in FIG. 8A.

The plurality of primary coils La*i*1 and La*i*2 each include a conductive member. The plurality of primary coils La*i*1 and La*i*2 and the plurality of diodes Da*i*1 and Da*i*2 are disposed in the space outside the secondary coil Lb but inside the transformer core TC*i*. That is, the plurality of primary coils La*i*1 and La*i*2 and the plurality of diodes Da*i*1 and Da*i*2 are disposed in the space between the secondary coil Lb and the transformer core TC*i*. The plurality of diodes Da*i*1 and Da*i*2 are each disposed in the vicinity of one of the plurality of primary coils La*i*1 and La*i*2. The plurality of diodes Da*i*1 and Da*i*2 are arranged at approximately equal intervals around the secondary coil Lb. Arranging the plurality of diodes Da*i*1 and Da*i*2 at approximately equal intervals can suppress unevenness of the current flowing through the plurality of diodes Da*i*1 and Da*i*2 and can prevent the load from concentrating on part of the plurality of diodes Da*i*1 and Da*i*2. The plurality of primary coils La*i*1 and Lai2 and the plurality of diodes Dai1 and Dai2 are alternately arranged in the circumferential direction around the secondary coil Lb.

The arrangement of the elements described above will be described in detail with reference to FIG. 8B.

The direction −V is assumed to be a third direction. The direction +V is assumed to be a fourth direction. It is further assumed that the position and shape of the magnetic circuit MC coincide with the position and shape of a closed curve along the center of the cross section of the transformer core TCi. The area inside the magnetic circuit MC in the plan view shown in FIG. 8A is referred to as "inside the magnetic circuit". The area outside the magnetic circuit MC in the plan view shown in FIG. 8A is referred to as "outside the magnetic circuit".

It is also assumed that a first node N1 and a second node N2 are located inside the magnetic circuit and shifted in the third direction from the first plane PLi. It is also assumed that a third node N3 is located outside the magnetic circuit and shifted in the third direction from the first plane PLi. The third node N3 is connected to the reference potential via the substrate E1i.

The substrate E1i is shifted in the third direction from the first plane PLi and connects the second node N2 to the third node N3. The substrate E1i has the function of the first conductor in the present disclosure.

It is further assumed that a fourth node N4 is located inside the magnetic circuit and shifted in the fourth direction from the first plane PLi.

It is also assumed that a fifth node N5 is located outside the magnetic circuit and shifted in the fourth direction from the first plane PLi. The fifth node N5 is connected to the reference potential via the substrate E2i.

The substrate E2i is shifted in the fourth direction from the first plane PLi and connects the fourth node N4 to the fifth node N5. The substrate E2i has the function of the second conductor in the present disclosure.

The diode Dai2 is located between and connected to the first node N1 and the second node N2. The anode of the diode Dai2 is connected to the first node N1, and the cathode of the diode Dai2 is connected to the second node N2. The same may hold true for the other diodes provided in the primary electric circuit Eai, although not shown in FIG. 8B.

The m pulse generators Pi1 to Pim are located between and connected to the first node N1 and the third node N3. The m pulse generators Pi1 to Pim include the m capacitors Ci1 to Cim and the m switches SWi1 to SWim. In each pulse generator Pij of the m pulse generators Pi1 to Pim, the capacitor Cij and the switch SWij are connected in series with each other, as shown in FIG. 8B.

The m switches SWi1 to SWim include m MOSFETs. The source terminals of the m MOSFETs, which form the m switches SWi1 to Swim, are electrically connected to the substrate E1i at the third node N3 and connected to the reference potential via the substrate E1i. The gate terminals of the m MOSFETs, which form the m switches SWi1 to Swim, are connected to the m switch drivers DRi1 to DRim via signal lines, respectively. The drain terminals of the m MOSFETs, which form the m switches SWi1 to Swim, are electrically connected to one-side terminals of the m capacitors Ci1 to Cim, respectively. The output terminal of the charger 12 (see FIG. 6) is electrically connected to a conductive member that connects the m switches SWi1 to SWim to the m capacitors Ci1 to Cim.

The other-side terminals of the m capacitors Ci1 to Cim are electrically connected to the first node N1 via a conductive member. The conductive member that connects the m capacitors Ci1 to Cim to the first node N1 is located between the transformer core TCi and the substrate E1i. An insulating member that is not shown is disposed between the substrate E1i and the conductive member that connects the m capacitors Ci1 to Cim to the first node N1.

The primary coil Lai1 is located between and connected to the first node N1 and the fourth node N4. The primary coil Lai1 includes a conductor. The conductor has, for example, a columnar shape. The conductor is located inside the magnetic circuit. One end of the conductor is electrically connected to the substrate E2i at the fourth node N4 and connected to the reference potential via the substrate E2i. The other end of the conductor is connected to the first node N1. The conductor provided in the primary coil Lai1 corresponds to the third conductor in the present disclosure. The same may hold true for the other primary coils not shown in FIG. 8B but provided in the primary electric circuit Eai.

The plurality of conductive members E3i and E4i are located and electrically connected to between the substrates E1i and E2i.

The arrangement described above allows formation of a primary electric circuit Eai comparable to the primary electric circuit Eai described with reference to FIG. 6.

Furthermore, the diode Dai2 is desirably located inside the magnetic circuit. The configuration described above allows a current to flow through the diode Dai2 to the reference potential along a short current path when an induced electromotive force is generated in the plurality of primary coils Lai1 and Lai2. The same applies to the other diodes excluding the diode Dai2.

Furthermore, the m pulse generators Pi1 to Pim are desirably located outside the magnetic circuit. The configuration described above allows the space inside the magnetic circuit to be secured as a space where the primary coil Lai1, the secondary coil Lb, and other components are placed. The transformer core TCi, the primary coil Lai1, the secondary coil Lb, and other components can therefore be so disposed as to efficiently transfer the magnetic energy.

The other points in the second embodiment are the same as those in the first embodiment.

4. Pulse Power Module in which n Primary Electric Circuits are Stacked

Figure 9:
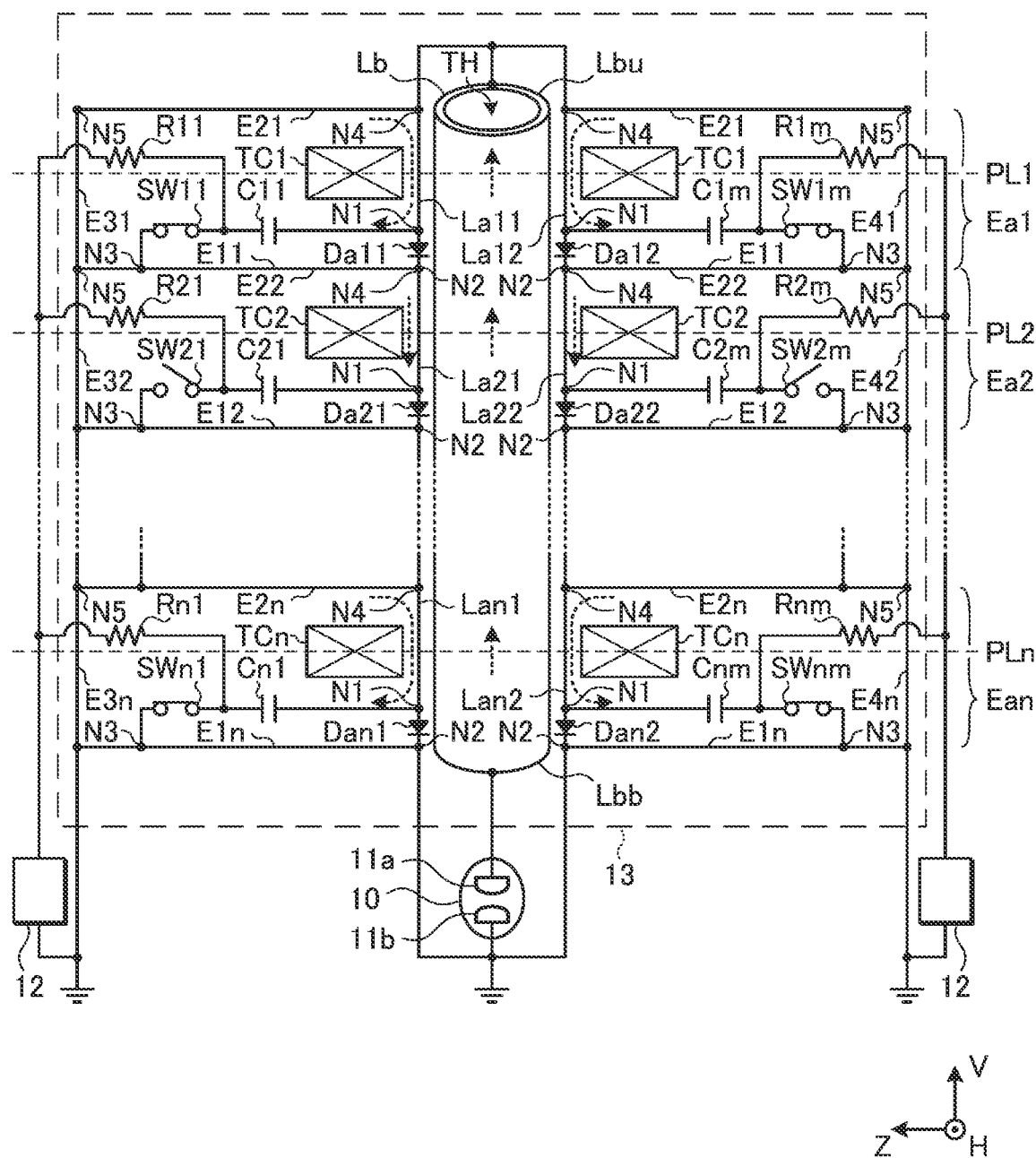
FIG. 9 schematically shows the structure of the pulse power module 13 according to a third embodiment formed of n primary electric circuits Ea1 to Ean and n transformer cores TC1 to TCn.

FIG. 9 schematically shows the structure of the pulse power module 13 according to a third embodiment, which is formed of the n primary electric circuits Ea1 to Ean and the n transformer cores TC1 to TCn. The n transformer cores TC1 to TCn are juxtaposed in the direction V. The n transformer cores TC1 to TCn are so disposed that first surfaces PL1 to PLn thereof are parallel to the plane HZ.

The secondary coil Lb is so disposed as to pass through the through hole of each of the n transformer cores TC1 to TCn. An upper end Lbu of the secondary coil Lb is connected to the reference potential, and a lower end Lbb of the secondary coil Lb is connected to the discharge electrode 11a. The term "coil" in the present disclosure is not limited to conductive wires turned multiple times. A conductive member that simply passes through the through hole of the transformer core TCi also corresponds to the coil in the present disclosure as long as the conductive member is capable of transmitting magnetic energy to and from the transformer core TCi. The secondary coil Lb corresponds to the n secondary coils Lb1 to Lbn connected in series to each other described with reference to FIG. 6.

The n primary electric circuits Ea1 to Ean are juxtaposed in the direction V. The plurality of primary coils Lai1 and Lai2 provided in each primary electric circuit Eai of the n primary electric circuits Ea1 to Ean are located in the space inside the transformer core TCi but outside the secondary coil Lb.

A substrate E1$i$ provided in the primary electric circuit Ea1 may include a conductive member common to a substrate E22 provided in the primary electric circuit Ea2 adjacent to the primary electric circuit Ea1. That is, the substrate E1$i$ provided in the primary electric circuit Eai may include a conductive member common to a substrate E2$i$+1 provided in a primary electric circuit Eai+1, where i is a natural number ranging from 1 to n−1. The substrate E1$i$ itself may instead also serve as the substrate E2$i$+1, and the substrate E2$i$+1 may be omitted.

In one primary electric circuit Eai out of the n primary electric circuits Ea1 to Ean, the output terminal of the charger 12 is electrically connected to the conductive member that connects the m capacitors Ci1 to Cim to the m switches SWi1 to SWim. Resistors Ri1 to Rim may be located between and connected to the charger 12 and the pulse generators Pi1 to Pim of the primary electric circuit Eai, respectively. The connected resistors Ri1 to Rim can prevent a large current from flowing from the charger 12 to the reference potential via the switches SWi1 to SWim when the switches SWi1 to SWim are turned on. The charger 12 may be a common charger connected to the n primary electric circuits Ea1 to Ean.

In FIG. 9, the charger 12 is configured to charge the capacitors Cij provided in the n primary electric circuits Ea1 to Ean with the charging voltage ΔV.

For example, when the states of the m switches SW11 to SW1m provided in the primary electric circuit Ea1 are changed from the off state to the on state, a pulsed current flows from the m capacitors C11 to C1$m$. The pulsed current flowing from the capacitors C11 to C1$m$ flows into primary coils La11 and La12. The pulsed current flows in the primary coils La11 and La12 from the upper side to the lower side in FIG. 9. The pulsed current flowing in the primary coils La11 and La12 generates the magnetic flux in the transformer core TC1, and the generated magnetic flux generates an induced electromotive force in the secondary coil Lb.

A pulsed voltage is applied to the space between the pair of discharge electrodes 11$a$ and 11$b$ when the induced electromotive force is generated in the secondary coil Lb. The induced electromotive force generated in the secondary coil Lb when one primary electric circuit Ea1 is driven is approximately equivalent to the charging voltage ΔV provided by the charger 12. Let i be the number of primary electric circuits simultaneously driven out of the n primary electric circuits Ea1 to Ean, and the voltage applied to the space between the pair of discharge electrodes 11$a$ and 11$b$ is i·ΔV.

When the voltage is applied to the space between the pair of discharge electrodes 11$a$ and 11$b$ so that dielectric breakdown occurs, discharge occurs between the pair of discharge electrodes 11$a$ and 11$b$, so that a pulsed current flows in the secondary coil Lb. The pulsed current flows in the secondary coil Lb from the lower side to the upper side in FIG. 9. When the discharge occurs, the laser gas is excited, so that the pulsed laser light is generated.

It is now assumed that m switches SW21 to SW2$m$ provided in the primary electric circuit Ea2 are kept off. The induced electromotive force generated in primary coils La21 and La22 due to the pulsed current flowing in the secondary coil Lb is applied in the form of a forward bias voltage to diodes Da21 and Da22. A current thus flows from the primary coils La21 and La22 via the diodes Da21 and Da22 to the reference potential. The m switches SW21 to SW2$m$ and the charger 12 are thus not damaged.

The other points in the third embodiment are the same as those in the second embodiment.

5. Pulse Power Module Disposed in Laser Chamber

Figure 10A:
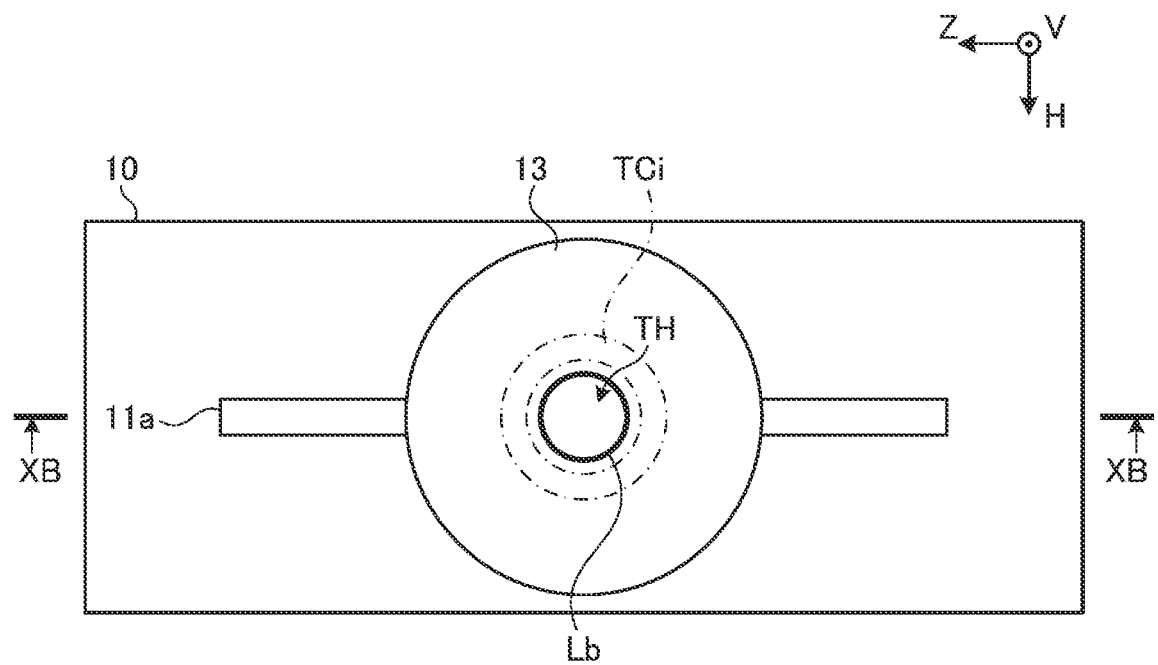
FIG. 10A is a plan view showing a fourth embodiment in which the pulse power module 13 is disposed in a laser chamber 10.
Figure 10B:
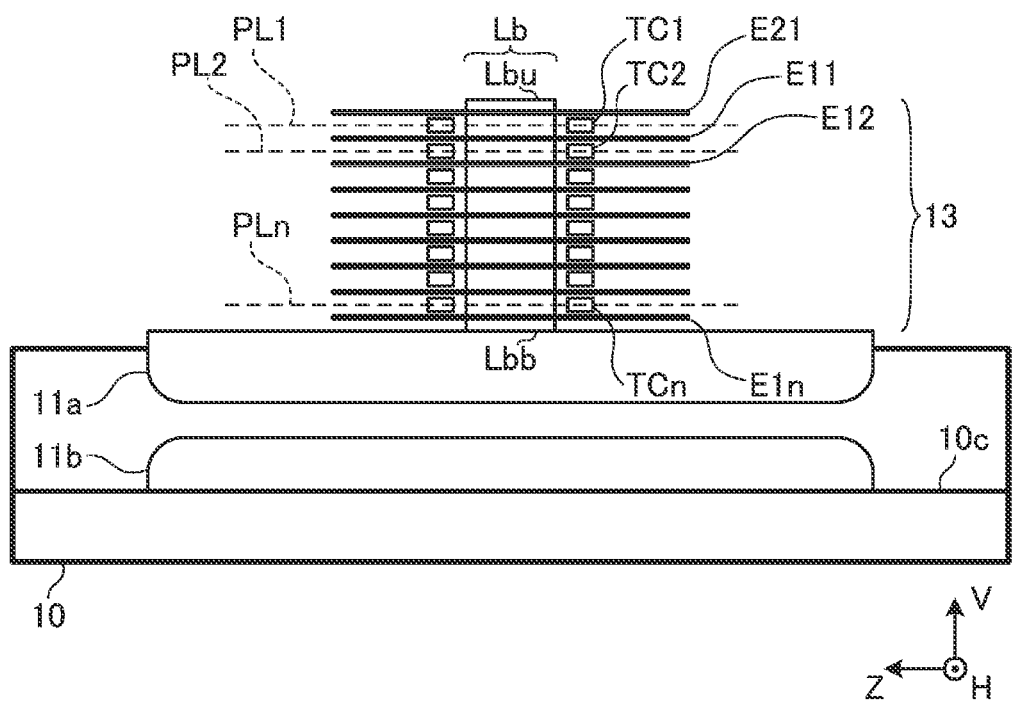
FIG. 10B is a cross-sectional view taken along the line XB-XB in FIG. 10A.

FIG. 10A is a plan view showing a fourth embodiment in which the pulse power module 13 is disposed in the laser chamber 10. FIG. 10B is a cross-sectional view taken along the line XB-XB in FIG. 10A. FIG. 10B shows only substrates E21 and E1$i$ to E1$n$ in association with the n primary electric circuits Ea1 to Ean and does not show the other circuit elements.

The n transformer cores TC1 to TCn are juxtaposed in the direction V, as shown in FIG. 10B. The n transformer cores TC1 to TCn are so disposed that the first surfaces PL1 to PLn thereof are parallel to the plane HZ.

The secondary coil Lb is so disposed as to pass through all the through holes of the n transformer cores TC1 to TCn. The upper end Lbu of the secondary coil Lb is connected to the reference potential, and the lower end Lbb of the secondary coil Lb is connected to the discharge electrode 11$a$. The discharge electrode 11$b$ is connected to the reference potential.

The substrate E21 and the n substrates E1$i$ to E1$n$ are so disposed as to sandwich the n transformer cores TC1 to TCn.

The configuration described above allows the pulsed high voltage generated by the pulse power module 13 to be applied directly to the discharge electrode 11$a$.

The other points in the fourth embodiment are the same as those in the third embodiment.

6. Pulse Power Module with Transformer Cores Elongated in Direction Z

Figure 11A:
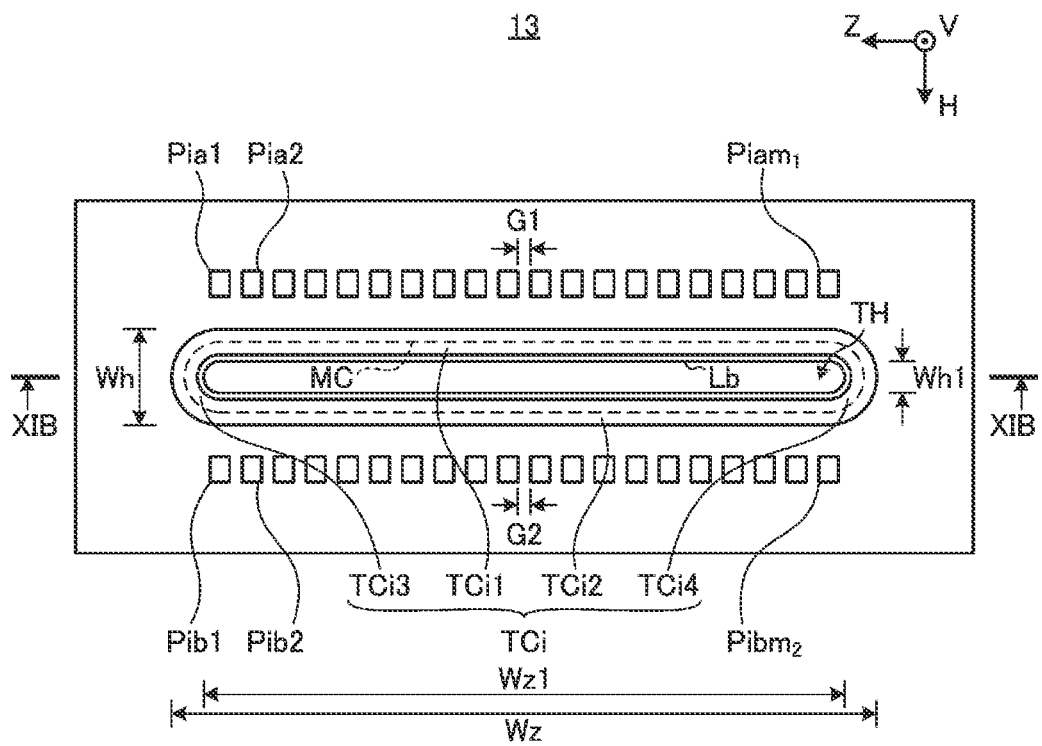
FIG. 11A is a plan view showing the state in which the pulse power module 13 in a fifth embodiment of the present disclosure is disposed in the laser chamber 10.
Figure 11B:
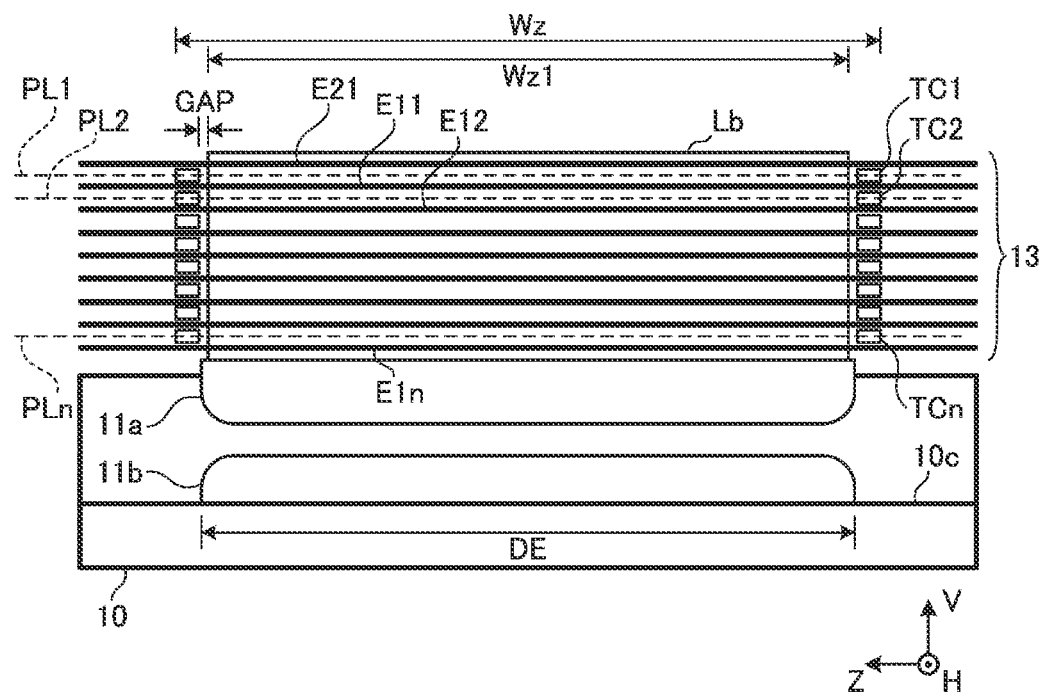
FIG. 11B is a cross-sectional view taken along the line XIB-XIB in FIG. 11A.

FIG. 11A is a plan view showing the state in which the pulse power module 13 in a fifth embodiment of the present disclosure is disposed in the laser chamber 10. FIG. 11B is a cross-sectional view taken along the line XIB-XIB in FIG. 11A.

The laser chamber 10 has almost the same shape as those of the substrates E11 to E1$n$ provided in the pulse power module 13 in the plan view shown in FIG. 11A. FIG. 11A therefore only shows the pulse power module 13. Since the n transformer cores TC1 to TCn have the same configuration and the n primary electric circuits Ea1 to Ean have the same configuration, reference character Xi is used as a substitute for the components X1 to Xn in FIG. 11A. FIG. 11A does not show the substrate E21.

6.1 Configuration of Transformer Cores

In the fifth embodiment, the transformer core TCi of the n transformer cores TC1 to TCn is so shaped that a width Wz in the direction Z is greater than a width Wh in the direction H. The direction Z is the first direction parallel to the first surfaces PL1 to PLn. The direction H is the second direction parallel to the first surfaces PL1 to PLn and perpendicular to the first direction. The transformer core TCi is so disposed that the longitudinal direction thereof, the direction Z, is parallel to the longitudinal direction of the pair of discharge electrodes 11$a$ and 11$b$.

The shape of the transformer core TCi will be described in more detail. The transformer core TCi includes first and second linear sections TCi1, TCi2 and first and second curved sections TCi3, TCi4. The first and second linear sections TCi1, TCi2 are disposed along the direction Z. The first curved section TCi3 connects ends of the first and second linear sections TCi1, TCi2 that are the ends facing the positive side of the direction Z to each other. The second curved section TCi4 connects ends of the first and second linear sections TCi1, TCi2 that are the ends facing the negative side of the direction Z to each other. In other words, the transformer core TCi has the shape of a racetrack.

The transformer core TCi may not have the shape described above and may have a rectangular or elliptical shape.

The direction-Z width Wz of the transformer core TCi is desirably greater than a longitudinal length DE of the pair of discharge electrodes 11a and 11b (see FIG. 11B). The direction-H width Wh of the transformer core TCi is desirably greater than the direction-H width of the pair of discharge electrodes 11a and 11b.

6.2 Configuration of Secondary Coil

The secondary coil Lb has a tubular shape having the through hole TH in the direction perpendicular to the first plane PLi with a width Wz1 in the direction Z being greater than a width Wh1 in the direction H. The ratio of the direction-Z width Wz1 of the secondary coil Lb to the longitudinal length DE of the pair of discharge electrodes 11a and 11b is desirably greater than or equal to 0.5 and smaller than or equal to 2. The ratio is more desirably greater than or equal to 0.8 but smaller than or equal to 1.2. The ratio is still more desirably about 1.

A gap GAP (see FIG. 11B) between the transformer core TCi and the secondary coil Lb is desirably smaller than or equal to 5 mm. The gap GAP is still more desirably greater than or equal to 1 mm but smaller than or equal to 3 mm.

6.3 Configuration of m Pulse Generators

The m pulse generators include $m_1$ pulse generators Pia1 to Pia$m_1$ and $m_2$ pulse generators Pib1 to Pib$m_2$, as shown in FIG. 11A. The pulse generators are located outside the magnetic circuit MC formed in the transformer core TCi. The $m_1$ pulse generators Pia1 to Pia$m_1$ are juxtaposed in the direction Z in positions shifted in the direction −H from the transformer core TCi. The $m_2$ pulse generators Pib1 to Pib$m_2$ are juxtaposed in the direction Z in positions shifted in the direction +H from the transformer core TCi. The $m_1$ pulse generators Pia1 to Pia$m_1$ and the $m_2$ pulse generators Pib1 to Pib$m_2$ are located on opposite sides of the transformer core TCi. FIG. 11A does not show the m switch drivers DRi1 to DRim.

Parameters $m_1$ and $m_2$ are each a natural number greater than or equal to 2 but smaller than or equal to m. The parameters $m_1$ and $m_2$ may differ from each other but are desirably equal to each other. The $m_1$ pulse generators Pia1 to Pia$m_1$ are separate from each other by a first gap G1, and the $m_2$ pulse generators Pib1 to Pib$m_2$ are separate from each other by a second gap G2. The first gap G1 and the second gap G2 are desirably approximately equal to each other.

6.4 Effects

The above configuration of the transformer core TCi and secondary coil Lb allows reduction in unevenness in inductance across the secondary coil Lb and the discharge electrode 11a. The unevenness in the pulsed current in the longitudinal direction of the discharge electrode 11a can thus be reduced.

Reducing the gap GAP between the transformer core TCi and the secondary coil Lb allows efficient transmission of the magnetic energy between the transformer core TCi and the secondary coil Lb. Since the primary coils Lai1 and Lai2 (see FIGS. 8A and 8B) are located inside the transformer core TCi but outside the secondary coil Lb, the magnetic energy can be efficiently transmitted also between the transformer core TCi and the primary coils Lai1, Lai2.

Juxtaposing the $m_1$ pulse generators Pia1 to Pia$m_1$ and the $m_2$ pulse generators Pib1 to Pib$m_2$ in the longitudinal direction of the discharge electrode 11a further allows reduction in the unevenness in the pulsed current in the longitudinal direction of the discharge electrode 11a. Setting the first gap G1 between the $m_1$ pulse generators Pia1 to Pia$m_1$ and the second gap G2 between the $m_2$ pulse generators Pib1 to Pib$m_2$ to be approximately equal to each other allows further reduction in the unevenness in the pulsed current in the longitudinal direction of the discharge electrode 11a. The other points in the fifth embodiment are the same as those in the fourth embodiment.

7. Others

Figure 12:
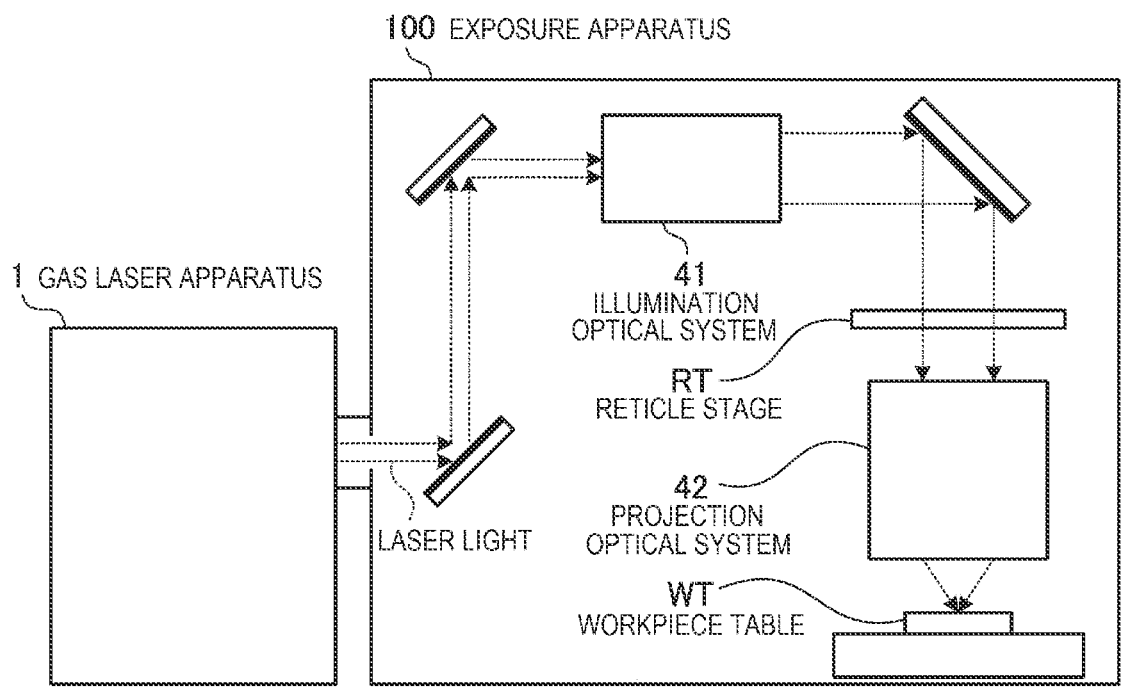
FIG. 12 schematically shows the configuration of an exposure apparatus 100 connected to the gas laser apparatus 1.

FIG. 12 schematically shows the configuration of the exposure apparatus 100 connected to the gas laser apparatus 1. The gas laser apparatus 1 is configured to generate laser light and output the laser light to the exposure apparatus 100, as described above.

In FIG. 12, the exposure apparatus 100 includes an illumination optical system 41 and a projection optical system 42. The illumination optical system 41 is configured to illuminate a reticle pattern on a reticle stage RT with the laser light having entered the exposure apparatus 100 from the gas laser apparatus 1. The projection optical system 42 is configured to perform reduction projection of the laser light having passed through the reticle to bring the laser light into focus on a workpiece that is not shown but is placed on a workpiece table WT. The workpiece is a photosensitive substrate onto which a photoresist has been applied, such as a semiconductor wafer. The exposure apparatus 100 is configured to translate the reticle stage RT and the workpiece table WT in synchronization with each other to expose the workpiece to the laser light having reflected the reticle pattern. An electronic device can be manufactured by transferring a device pattern onto the semiconductor wafer in the exposure step described above.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A high-voltage pulse generation device configured to apply a pulsed high voltage to a space between a pair of discharge electrodes disposed in a laser chamber of a gas laser apparatus, the high-voltage pulse generation device comprising:
   n transformer cores that form a transformer, where n is a natural number greater than or equal to two;
   n primary electric circuits of the transformer, the n primary electric circuits each having a first terminal connected to a reference potential and a second terminal connected to a charger, the n primary electric circuits each including one or more primary coils, one or more diodes connected in parallel to the one or more primary coils, and one or more pulse generators connected in parallel to the one or more primary coils; and
   a secondary electric circuit of the transformer, the secondary electric circuit including a secondary coil and connected to the pair of discharge electrodes, wherein
   each of the one or more pulse generators has a third terminal and outputs a pulsed current through the third terminal, and
   the reference potential is a ground potential and connected to a cathode of each of the one or more diodes and to the third terminal.

2. The high-voltage pulse generation device according to claim 1,
   wherein the one or more pulse generators each include a capacitor and a switch connected in series to the capacitor, the switch is connected to the reference potential and the cathode, and the capacitor is connected to an anode of each of the one or more diodes.

3. The high-voltage pulse generation device according to claim 2,
   wherein the one or more diodes are so disposed that an electromotive force generated in the one or more primary coils by a current flowing through the secondary coil causes a forward bias voltage to be applied to the one or more diodes.

4. The high-voltage pulse generation device according to claim 2,
   wherein the one or more diodes are so disposed that a pulse voltage from the one or more pulse generators is applied as a reverse bias voltage to the one or more diodes.

5. The high-voltage pulse generation device according to claim 2,
   wherein the second terminal is connected to the capacitor and the switch.

6. The high-voltage pulse generation device according to claim 5,
   wherein a resistor is located between and connected to the charger and the one or more pulse generators.

7. The high-voltage pulse generation device according to claim 1,
   wherein the one or more diodes are each disposed in a vicinity of one of the one or more primary coils.

8. The high-voltage pulse generation device according to claim 1,
   wherein the secondary coil has a tubular shape.

9. The high-voltage pulse generation device according to claim 8,
   wherein the one or more diodes include a plurality of diodes.

10. The high-voltage pulse generation device according to claim 9,
    wherein the plurality of diodes are arranged at approximately equal intervals around the secondary coil.

11. The high-voltage pulse generation device according to claim 8,
    where the one or more diodes are each disposed between one of the n transformer cores and the secondary coil.

12. The high-voltage pulse generation device according to claim 8,
    wherein the n transformer cores each have a through hole, and
    the secondary coil is so disposed as to pass through the through hole of each of the n transformer cores and has one end connected to a reference potential and another end connected to one of the pair of discharge electrodes.

13. The high-voltage pulse generation device according to claim 12,
    wherein a gap between each of the n transformer cores and the secondary coil is smaller than or equal to 5 mm.

14. The high-voltage pulse generation device according to claim 1,
    wherein the n transformer cores are each configured to form a magnetic circuit along a first plane, and the n transformer cores each have a width in a first direction parallel to the first plane that is greater than a width in a second direction parallel to the first plane but perpendicular to the first direction.

15. The high-voltage pulse generation device according to claim 1,
    wherein the n transformer cores are each configured to form a magnetic circuit along a first plane,
    the n primary electric circuits each further include
    first and second nodes shifted from the first plane in a third direction perpendicular to the first plane and located inside the magnetic circuit,
    a third node shifted from the first plane in the third direction, located outside of the magnetic circuit, and connected to the reference potential,
    a first conductor shifted from the first plane in the third direction and connecting the second node to the third node,
    a fourth node shifted from the first plane in a fourth direction opposite the third direction and located inside the magnetic circuit,
    a fifth node shifted from the first plane in the fourth direction, located outside the magnetic circuit, and connected to the reference potential, and
    a second conductor shifted from the first plane in the fourth direction and connecting the fourth node to the fifth node,
    one of the one or more diodes is located between and connected to the first node and the second node,
    one of the one or more pulse generators is located between and connected to the first node and the third node, and
    one of the one or more primary coils includes a third conductor, and the third conductor is located inside the magnetic circuit and configured to connect the first node to the fourth node.

16. The high-voltage pulse generation device according to claim 15,
    wherein the one or more diodes are located inside the magnetic circuit.

17. The high-voltage pulse generation device according to claim 15,
wherein the one or more pulse generators are located outside the magnetic circuit.

18. The high-voltage pulse generation device according to claim 15,
wherein the n primary electric circuits include a first primary electric circuit and a second primary electric circuit, and
at least part of the first conductor provided in the first primary electric circuit is common to at least part of the second conductor provided in the second primary electric circuit.

19. A gas laser apparatus comprising:
a laser chamber;
a pair of discharge electrodes disposed in the laser chamber; and
a high-voltage pulse generation device configured to apply a pulsed high voltage to a space between the pair of discharge electrodes,
the high-voltage pulse generation device including
n transformer cores that form a transformer, where n is a natural number greater than or equal to two,
n primary electric circuits of the transformer, the n primary electric circuits each having a first terminal connected to a reference potential and a second terminal connected to a charger, the n primary electric circuits each including one or more primary coils, one or more diodes connected in parallel to the one or more primary coils, and one or more pulse generators connected in parallel to the one or more primary coils, and
a secondary electric circuit of the transformer, the secondary electric circuit including a secondary coil and connected to the pair of discharge electrodes, wherein
each of the one or more pulse generators has a third terminal and outputs a pulsed current through the third terminal, and
the reference potential is a ground potential and connected to a cathode of each of the one or more diodes and to the third terminal.

20. A method for manufacturing an electronic device, the method comprising:
generating pulsed laser light by using a gas laser apparatus including
a laser chamber,
a pair of discharge electrodes disposed in the laser chamber, and
a high-voltage pulse generation device configured to apply a pulsed high voltage to a space between the pair of discharge electrodes,
the high-voltage pulse generation device including
n transformer cores that form a transformer, where n is a natural number greater than or equal to two,
n primary electric circuits of the transformer, the n primary electric circuits each having a first terminal connected to a reference potential and a second terminal connected to a charger, the n primary electric circuits each including one or more primary coils, one or more diodes connected in parallel to the one or more primary coils, and one or more pulse generators connected in parallel to the one or more primary coils, and
a secondary electric circuit of the transformer, the secondary electric circuit including a secondary coil and connected to the pair of discharge electrodes;
outputting the pulsed laser light to an exposure apparatus; and
exposing a photosensitive substrate to the pulsed laser light in the exposure apparatus to manufacture the electronic device, wherein
each of the one or more pulse generators has a third terminal and outputs a pulsed current through the third terminal, and
the reference potential is a ground potential and connected to a cathode of each of the one or more diodes and to the third terminal.

* * * * *